United States Patent
Noguchi et al.

(10) Patent No.: US 6,489,861 B2
(45) Date of Patent: Dec. 3, 2002

(54) ANTENNA DUPLEXER WITH DIVIDED AND GROUNDED TRANSMISSION LINE

(75) Inventors: Kazushige Noguchi, Tokyo (JP); Satoshi Terada, Tokyo (JP); Yoshiaki Fujita, Tokyo (JP); Tomokazu Komazaki, Tokyo (JP); Akira Mashimo, Fukaya (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/842,106

(22) Filed: Apr. 26, 2001

(65) Prior Publication Data

US 2001/0052830 A1 Dec. 20, 2001

(Under 37 CFR 1.47)

(30) Foreign Application Priority Data

Apr. 28, 2000 (JP) ........................................ 2000-131178

(51) Int. Cl.[7] .............................. H03H 9/72; H03H 9/64
(52) U.S. Cl. ..................................... 333/133; 333/193
(58) Field of Search ................... 333/133, 33, 193–196, 333/124–129, 132

(56) References Cited

U.S. PATENT DOCUMENTS

| | | | | |
|---|---|---|---|---|
| 5,561,406 A | * | 10/1996 | Ikata et al. | ............. 333/129 X |
| 6,104,920 A | * | 8/2000 | Llewellyn et al. | .......... 455/269 |
| 6,115,592 A | * | 9/2000 | Ueda et al. | ................. 455/307 |
| 6,255,916 B1 | * | 7/2001 | Nakamura et al. | .......... 333/195 |

FOREIGN PATENT DOCUMENTS

| | | | |
|---|---|---|---|
| JP | | 3-235503 | * 10/1991 |
| JP | | 04-34023 | 3/1992 |
| JP | | 05167388 A | 7/1993 |
| JP | | 6-350307 | * 12/1994 |
| JP | | 7-38376 | * 2/1995 |
| JP | | 09098046 A | 4/1997 |
| JP | | 9-172340 | * 6/1997 |
| JP | | 09-232909 | 9/1997 |
| JP | | 10-322105 | 12/1998 |
| JP | | 11-186872 | * 7/1999 |
| JP | | 2000-295075 | * 10/2000 |

* cited by examiner

*Primary Examiner*—Robert Pascal
*Assistant Examiner*—Barbara Summons
(74) *Attorney, Agent, or Firm*—Venable; Michael A. Sartori

(57) ABSTRACT

An antenna duplexer has a first filter and a second filter coupled to respective signal terminals and to a common node. The common node is coupled to an antenna terminal. The first filter has a higher-frequency passband than the second filter. A transmission-line circuit, inserted between the first filter and the common node, increases the impedance of the first filter in its lower stopband. The transmission-line circuit includes an internal node, a first transmission line coupling the internal node to the common node, a second transmission line coupling the internal node to the first filter, and a grounding circuit such as a capacitor coupling the internal node to ground. The grounding circuit further enhances the lower stopband impedance of the first filter.

9 Claims, 23 Drawing Sheets

ANTENNA DUPLEXER WITH DIVIDED AND GROUNDED TRANSMISSION LINE

BACKGROUND OF THE INVENTION

The present invention relates to mobile communication equipment, more particularly to an antenna duplexer that can be used in the wireless interface of a device such as a mobile telephone.

The antenna duplexer of a mobile telephone or other mobile communication device must be small in size, and must combine low passband insertion loss with high stopband attenuation. As the density of mobile communications in the radio frequency spectrum increases, the antenna duplexer must also be able to deal with increasingly close spacing between transmit and receive channels, and there is a further trend toward increasing bandwidths of these channels.

Antenna duplexers employing surface-acoustic-wave (SAW) filters are particularly suitable for meeting these requirements. Examples of antenna duplexers of this type can be found in Japanese Unexamined Patent Applications 9-98046 and 5-167388. FIG. 7 of the latter document (5-167388) is reproduced here as FIG. 1.

The antenna duplexer shown in FIG. 1 has two SAW filters $F_1$, $F_2$ coupled in parallel via nodes 'a' and 'b' to a pair of common signal terminals $T_0$. SAW filter $F_1$ leads to another pair of signal terminals $T_1$; SAW filter $F_2$ leads to still another pair of signal terminals $T_2$. Each SAW filter $F_1$, $F_2$ has a ladder network configuration comprising a series resonator (denoted $R_{S0}$ in $F_1$ and $R_S$ in $F_2$) and a shunt resonator (denoted $R_P$ in $F_1$ and $R_{P0}$ in $F_2$). Each of these resonators has a single pair of interdigital transducers (not visible) flanked by a pair of reflectors (not visible). The interdigital transducers and reflectors are formed from, for example, an aluminum-copper (Al-2% Cu) electrode material disposed on a lithium-tantalate (LT) substrate. As seen from the common signal terminals $T_0$, series resonator $R_{S0}$ forms the first stage of filter $F_1$, and shunt resonator $R_{P0}$ forms the first stage of filter $F_2$. If necessary, each filter $F_1$, $F_2$ may have additional series resonators and shunt resonators following one another in the same ladder pattern.

Filters $F_1$ and $F_2$ are bandpass filters with respective center frequencies $f_1$ and $f_2$, where $f_1$ is less than $f_2$. The passbands of the two filters $F_1$, $F_2$ must not overlap. Filter $F_2$ must have a high characteristic impedance in the passband of filter $F_1$, and filter $F_1$ must have a high characteristic impedance in the passband of filter $F_2$. In the antenna duplexer in FIG. 26, an extra length of signal line S is inserted in series with filter $F_2$ to increase its lower stopband impedance by producing a phase rotation.

An $f_1$ value of eight hundred eighty-seven megahertz (887 MHz) and an $f_2$ value of nine hundred thirty-two megahertz (932 MHz) are given as examples in the above-mentioned document (5-167388); these are the transmit frequency ($f_1$) and receive frequency ($f_2$) of a type of cordless telephone. When the antenna duplexer is used in this type of cordless telephone, the common terminals $T_0$ are coupled to the antenna, terminals $T_1$ are coupled to a transmitting circuit, and terminals $T_2$ are coupled to a receiving circuit. A cordless telephone has comparatively narrow transmit and receive bands, so the requirement that each filter must have a high stopband impedance in the other filter's passband is readily met by the simple circuit configuration in FIG. 1.

When this antenna duplexer configuration is used in a mobile communication system such as the Japanese CDMA-One system, in which the transmit frequency is higher than the receive frequency, filter $F_1$ becomes the receive filter and filter $F_2$ becomes the transmit filter. The Japanese CDMA-One system, however, has comparatively wide transmit-band and receive-band specifications; the proportional bandwidth (the bandwidth divided by the center frequency) is equal to 0.042 for the transmit band and 0.045 for the receive band. Moreover, the spacing between the lowest transmit frequency and the highest receive frequency is less than half the passband width. The simple duplexer configuration in FIG. 1 fails to provide the desired combination of low passband insertion loss and high stopband impedance for this system, and for other mobile communication systems with wide, closely spaced transmit and receive bands.

SUMMARY OF THE INVENTION

An object of the present invention is to provide an antenna duplexer that combines low insertion loss in both the transmit and receive passbands with an adequately high characteristic impedance in the relevant stopbands (the transmit stopband in which the receive passband is located, and the receive stopband in which the transmit passband is located).

The invented antenna duplexer has a common node, first and second signal terminals, a first filter coupled between the common node and the first signal terminal, a second filter coupled between the common node and the second signal terminal, and an antenna signal terminal coupled to the common node. The first and second filters each have at least one series resonator and at least one shunt resonator coupled in a ladder configuration. The first filter has a higher passband than the second filter.

The antenna duplexer also has a transmission-line circuit with an internal node, a first transmission line coupling the internal node to the common node, a second transmission line coupling the internal node to the first filter, and a grounding circuit coupling the internal node to ground. The grounding circuit comprises, for example a capacitor coupled between the internal node and a ground node.

The grounding circuit increases the stopband impedance of the first filter in the region of the passband of the second filter, and improves impedance matching as seen from the antenna signal terminal.

DETAILED DESCRIPTION OF THE INVENTION

Figure 1:
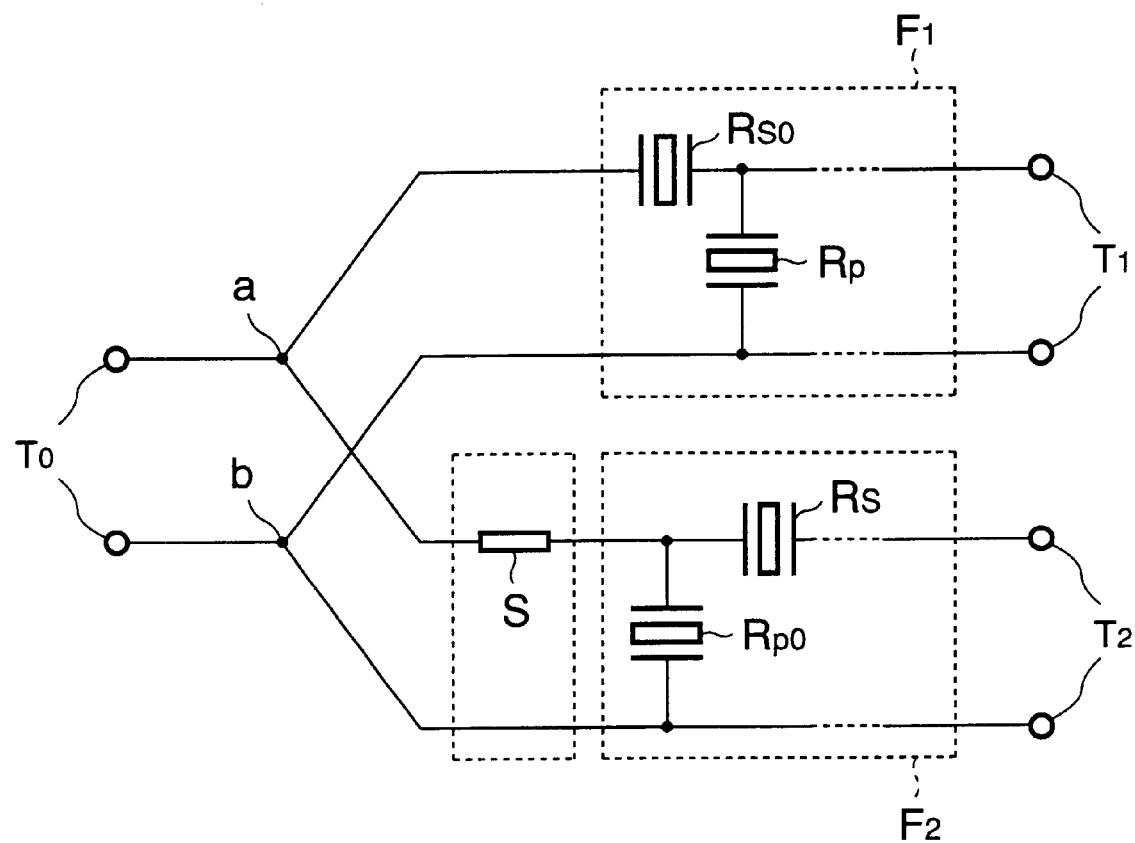
FIG. 1 is a circuit diagram of a prior-art antenna duplexer.

Embodiments of the invention will be described with reference to the attached drawings, in which like parts are indicated by like reference characters.

Figure 2:
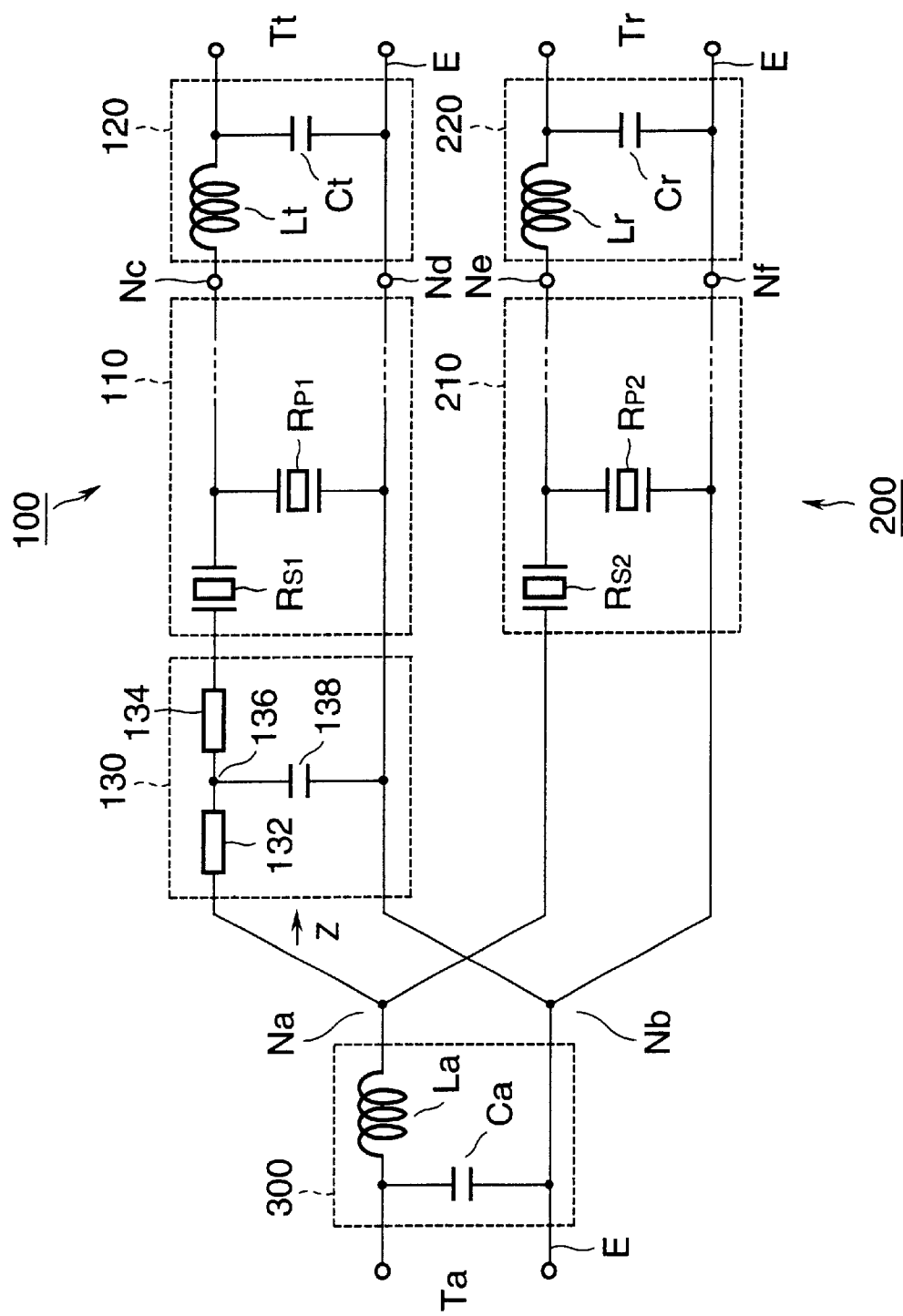
FIG. 2 is a circuit diagram of a first antenna duplexer embodying the invention.

FIG. 2 is a circuit diagram of an antenna duplexer illustrating a first embodiment of the invention. This embodiment is suitable for a mobile telephone operating under the Japanese CDMA-One system, in which the transmit frequency band is 887–925 MHz and the receive frequency band is 832–870 MHz (the bandwidth being 38 MHz in both cases).

The antenna duplexer in FIG. 2 carries signals from a pair of antenna terminals Ta to a pair of receive terminals Tr, and from a pair of transmit terminals Tt to the antenna terminals Ta. One terminal in each pair is a ground terminal E. The antenna duplexer comprises a transmit arm 100 disposed between the transmit terminals Tt and a pair of common nodes Na, Nb, a receive arm 200 disposed between the receive terminals Tr and the common nodes Na, Nb, and an antenna-end matching circuit 300 disposed between the antenna terminals Ta and the common nodes Na, Nb. The term 'ground node' will be used below to denote node Nb and the lines leading from it to the ground terminals marked E. The three terminals not marked E are signal terminals.

The transmit arm 100 comprises a transmit filter 110, a transmit-arm matching circuit 120, and a transmit-arm transmission-line circuit 130. The receive arm 200 comprises a receive filter 210 and a receive-arm matching circuit 220.

The transmit and receive filters 110, 210 are SAW filters similar to the ones shown in FIG. 1, each comprising resonators of the type having a single pair of interdigital transducers (not visible) and a pair of reflectors (not visible), the resonators being coupled in a ladder network. As seen from the antenna terminals Ta, the first stage of transmit filter 110 (the stage closest to the common nodes Na, Nb) is a series resonator $R_{S1}$ (disposed in a series arm of the ladder network). This series resonator $R_{S1}$ is coupled to node Na through the transmit-arm transmission-line circuit 130. The first stage of the receive filter 210 as seen from the antenna terminals Ta is a series resonator $R_{S2}$, which is coupled directly to common node Na. The second stage of each filter is a shunt resonator ($R_{P1}$, $R_{P2}$) disposed in a shunt arm of the ladder network.

The transmit-arm transmission-line circuit 130 has a first transmission line 132 and a second transmission line 134 interconnected at an internal node 136. The first transmission line 132 couples the internal node 136 to common node Na. The second transmission line 134 couples internal node 136 to resonator $R_{S1}$ in the transmit filter 110. The transmit-arm transmission-line circuit 130 also has a capacitor 138 that functions as a grounding circuit by coupling the internal node 136 to the ground node E.

The transmission lines 132, 134 increase the impedance of the transmit arm 100 in the lower stopband of the transmit filter 110. The impedance of the transmit filter 110 alone in this stopband, in which the passband of the receive filter 210 is located, is inadequate. In order to minimize the effect on the receive filter 210, the lengths of the transmission lines 132, 134 are optimized so as to make the impedance approach infinity; more precisely, to approach the point at infinity on a Smith chart.

The transmission lines 132, 134 are copper-nickel-gold striplines formed on a bismaleimide-triazine (BT) resin substrate by depositing films of copper, then nickel, and finally gold. Both striplines are thirty-three micrometers (33 $\mu$m) thick and 0.14 millimeter (0.14 mm) wide. The first transmission line 132 is 21.5 mm long. The second transmission line 134 is 18.5 mm long.

The capacitor 138 that grounds the internal node 136 has the effect of reducing the size of the phase loops of the impedance as seen from the antenna terminals Ta (on the Smith chart). Accordingly, this capacitor 138 reduces the degree of impedance mismatch.

The matching circuits 120, 220, 300 are provided next to terminals Tt, Tr, Ta, respectively, for impedance matching in the passbands. Each matching circuit uses a lumped-constant low-pass filter (LPF) having a series inductor and a shunt capacitor forming an L-section matching network. The transmit-arm matching circuit 120 comprises inductor Lt and capacitor Ct. The receive-arm matching circuit 220 comprises inductor Lr and capacitor Cr. The antenna-end matching circuit 300 comprises inductor La and capacitor Ca. In each case the capacitor couples one terminal of the inductor to the ground node. The impedance Za of the antenna-end matching circuit 300 as seen from common nodes Na, Nb, the impedance Zt of the transmit-arm matching circuit 120 as seen from nodes Nc, Nd, and the impedance Zr of the receive-arm matching circuit 220 as seen from nodes Ne, Nf are all approximately equal to fifty ohms (50Ω), which is the characteristic impedance of the circuit.

In this circuit configuration, the transmit arm 100 inserts series resonator $R_{S1}$ between the transmit terminals Tt and antenna terminals Ta, on the side of filter 110 that is coupled to filter 210, and also inserts the transmit-arm transmission-line circuit 130 in series with filter 110, for the purpose of phase rotation. The receive arm 200 inserts series resonator $R_{S2}$ between the receive terminals Tr and antenna terminals Ta, on the side of filter 210 that is coupled to filter 110.

Figure 3:
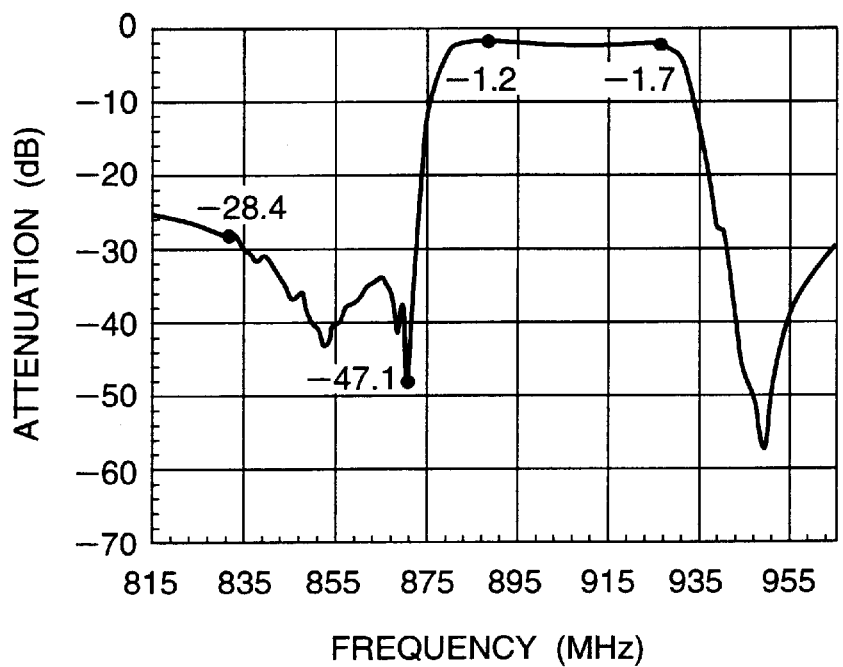
FIG. 3 is a graph showing a frequency characteristic of the transmit filter in FIG. 2.
Figure 4:
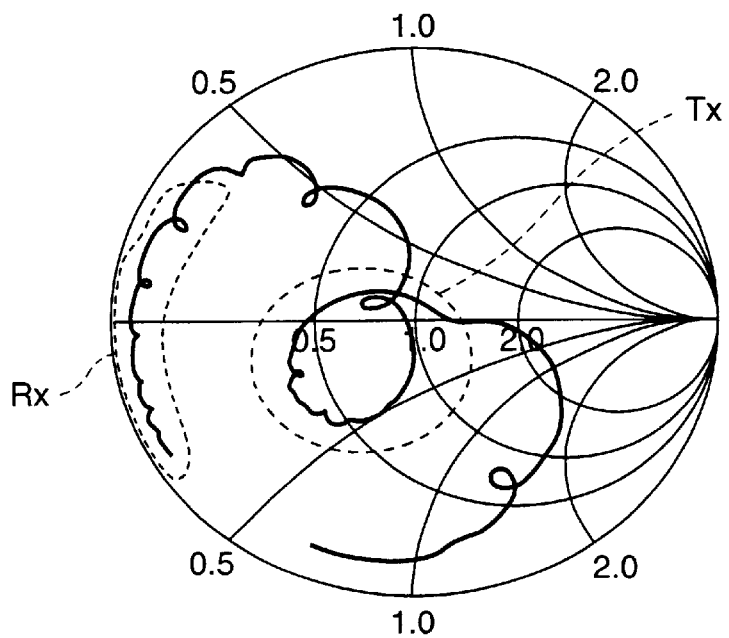
FIG. 4 is a Smith chart showing an impedance characteristic of the transmit filter in FIG. 2.
Figure 5:
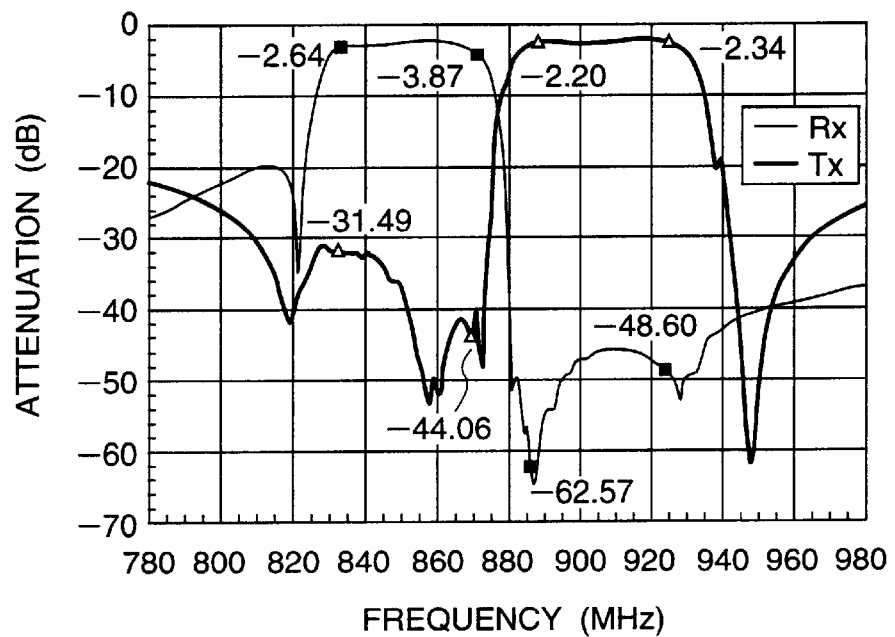
FIG. 5 is a graph showing frequency characteristics of the antenna duplexer in FIG. 2.
Figure 6:
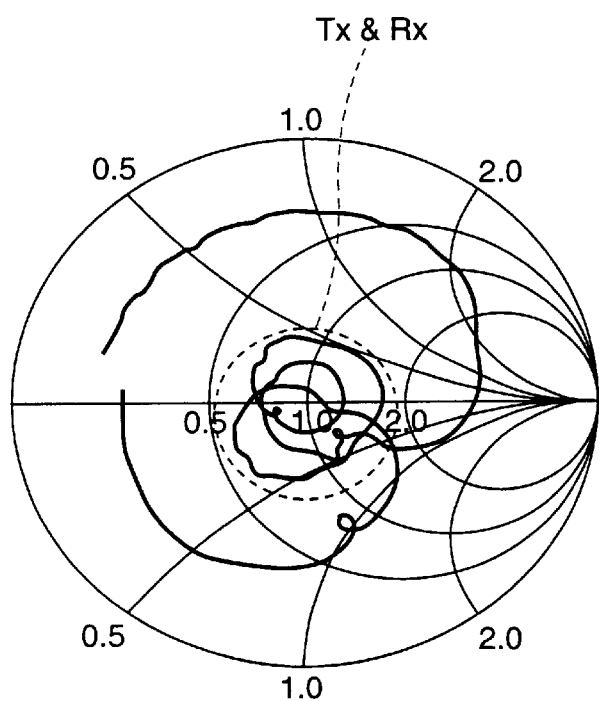
FIG. 6 is a Smith chart showing an antenna-terminal impedance characteristic of the antenna duplexer in FIG. 2.
Figure 7:
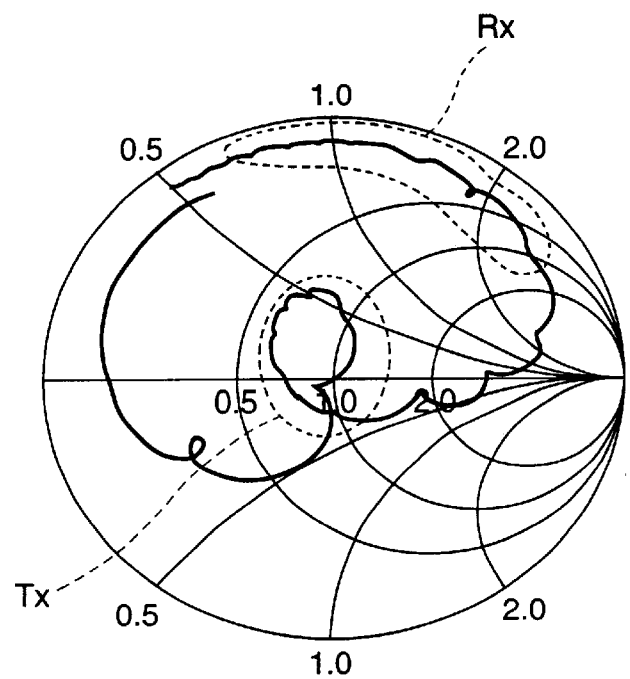
FIG. 7 is a Smith chart showing a transmit-terminal impedance characteristic of the antenna duplexer in FIG. 2.
Figure 8:
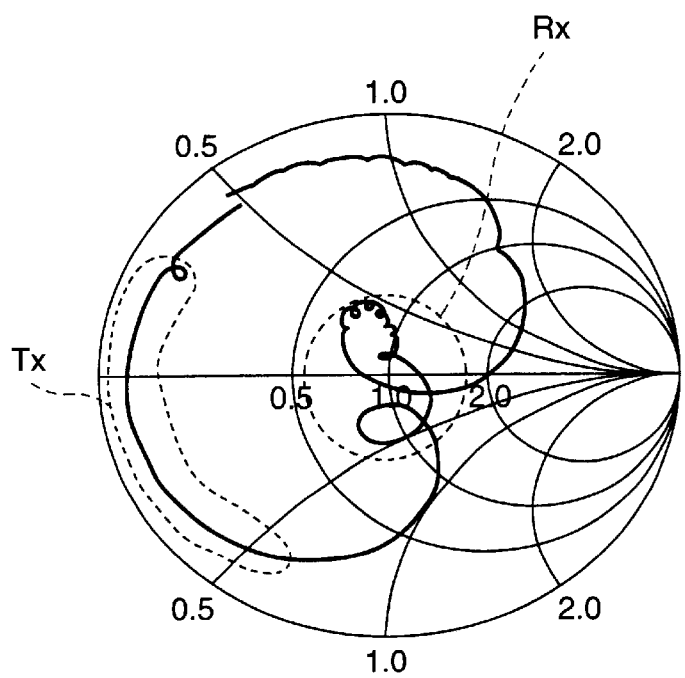
FIG. 8 is a Smith chart showing a receive-terminal impedance characteristic of the antenna duplexer in FIG. 2.

FIG. 3 shows the frequency characteristic and FIG. 4 shows the transmit-terminal impedance characteristic of the transmit filter 110 alone (without the transmit-arm transmission-line circuit 130). FIGS. 5 to 8 show frequency and impedance characteristics of the antenna duplexer as a whole (including the transmit-arm transmission-line circuit 130). FIG. 5 shows the transmit (Tx) and receive (Rx) frequency characteristics. FIG. 6 shows the antenna-terminal (Ta) impedance (Za) characteristic. FIG. 7 shows the transmit-terminal (Tt) impedance (Zt) characteristic. FIG. 8 shows the receive-terminal (Tr) impedance (Zr) characteristic.

From the Smith chart in FIG. 4, the impedance of the transmit filter 110 alone (without the transmit-arm transmission-line circuit 130) in the receive (Rx) band of 832–870 MHz varies from 1.50–j0.22 to 3.34+j0.29, where j is the square root of minus one. Insertion of transmission lines with lengths optimized to increase the impedance of the transmit filter in this receive band gives the impedance characteristics as seen from the antenna terminals in FIG. 6, from the transmit terminals in FIG. 7, and from the receive terminals in FIG. 8.

Referring again to FIG. 2, the impedance Z of the transmit filter 110 as seen from the common nodes Na, Nb is calculated as follows. The impedance of the receive filter 210 is calculated in a generally similar manner.

First, if the capacitor 138 is removed, the F matrix of a quarter-wave ($\lambda/4$) transmission line has the following form.

$$\begin{bmatrix} 0 & jZ_0 \\ \frac{j}{Z_0} & 0 \end{bmatrix}$$

The F matrix of the transmit filter 110 has the following form.

$$\begin{bmatrix} 1 & 0 \\ \frac{1}{Z_1} & 1 \end{bmatrix}$$

If these circuits are cascaded, the resulting F matrix can be calculated as follows.

$$\begin{bmatrix} 0 & jZ_0 \\ \frac{j}{Z_0} & 0 \end{bmatrix}\begin{bmatrix} 1 & 0 \\ \frac{1}{Z_1} & 1 \end{bmatrix} = \begin{bmatrix} \frac{jZ_0}{Z_1} & jZ_0 \\ \frac{j}{Z_0} & 0 \end{bmatrix}$$

As for the impedance Z when the transmit-arm transmission-line circuit 130 is viewed from the common nodes Na, Nb, if the F-matrix is expressed as follows $$\begin{bmatrix} A & B \\ C & D \end{bmatrix}$$

then $$Z = A/C$$

Z can therefore be calculated as follows.

$$Z = A/C = Z_0^2/Z_1 = 9.565 + j118.2$$

where $Z_0$ is the characteristic impedance (50Ω) of the transmission line, and $Z_1$ is the input impedance (1.50–j11.2) of the transmit filter 110.

SAW bandpass filters generally have a lower impedance in the lower stopband than in the upper stopband. In the filters being considered here, the impedance of the filter as seen from the antenna in the 832–870 MHz band is close to zero (from about 1.50–j11.2 to 3.66+j15.64). Insertion of the quarter-wave transmission line enhances the impedance.

At 832 MHz, the relation $Z = Z_0^2/Z_1$ and the small impedance ($Z_1$) of the transmit filter produce a large Z value, from 9.565+j118.2 to 81.54–j228.8. In the transmit band from 887 MHz to 925 MHz, the impedance of the transmit filter is matched to 50Ω and $Z_0$ is also 50Ω, so the relation $Z = Z_0^2/Z_1$ ensures that the input impedance seen from the common nodes Na, Nb will be substantially 50Ω. The theoretical coupling loss is therefore low, and the efficiency of the antenna duplexer is high.

When the capacitor 138 is inserted, the F matrix of the transmit-arm transmission-line circuit 130 in FIG. 2 can be expressed as the following matrix product.

$$\begin{bmatrix} \cos\theta_1 & j\cdot\sin\theta_1 \\ j\cdot\sin\theta_1 & \cos\theta_1 \end{bmatrix}\begin{bmatrix} 1 & 0 \\ j\omega C_{ST} & 1 \end{bmatrix}\begin{bmatrix} \cos\theta_2 & j\cdot\sin\theta_2 \\ j\cdot\sin\theta_2 & \cos\theta_2 \end{bmatrix}$$

In this expression, $\theta_1 = \beta \cdot d_1$, $\theta_2 = \beta \cdot d_2$, $\beta$ is a wavelength constant equal to $\omega/c$ (where c is the speed of light and $\omega$ is the wavelength), and $d_1$ and $d_2$ are the lengths of the striplines 132, 134, respectively. This expression can be used to calculate the impedance Z of the transmit filter 110 and receive filter 210 seen from the common nodes Na, Nb in the manner shown above.

Figure 9:
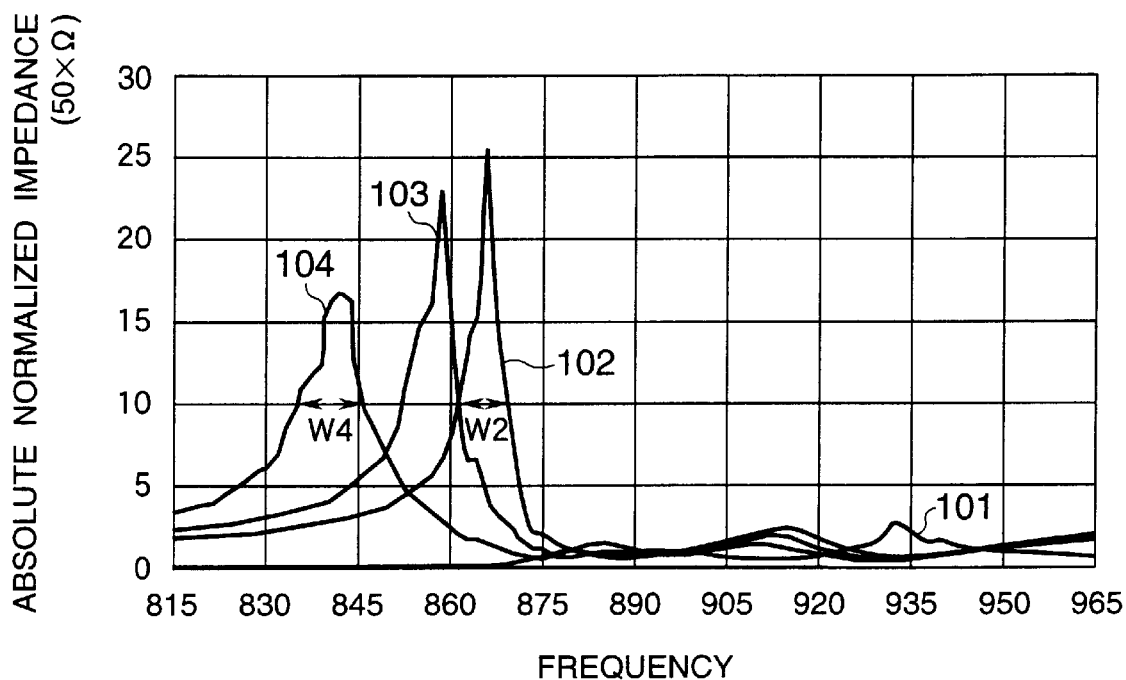
FIG. 9 shows impedance characteristics of the antenna duplexer in FIG. 2 with various modifications of the transmit-arm transmission-line circuit.
Figure 10:
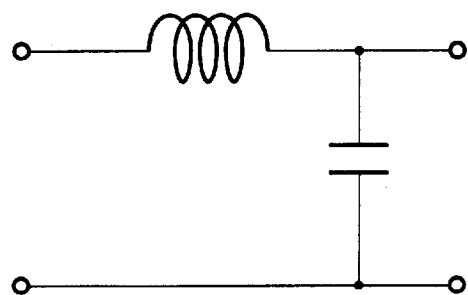
FIGS. 10, 11, 12, 13, 14, and 15 show various matching circuits that can be used in place of the matching circuits in FIG. 2.
Figure 11:
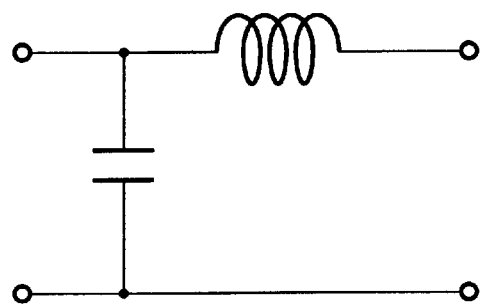

FIG. 9 shows absolute impedance characteristics when the transmit-arm transmission-line circuit 130 is absent (curve 101) or is replaced with a single 40-mm stripline (curve 102), and when the transmit-arm transmission-line circuit 130 is present and the capacitor 138 has a capacitance of 1.5 picofarads (1.5 pF, curve 103), or 2.5 pF (curve 104). In the present embodiment, the capacitance of capacitor 138 is 2.5 pF (curve 104). The value ten on the vertical axis represents the level at which the impedance is high enough so that the received signal is effectively shut out from the transmit arm 100. Dividing the stripline into two parts and inserting a 2.5-pF shunt capacitor 138 can be seen to increase the width of the range in which this level is reached from W2 in curve 102 to W4 in curve 104.

In complex terms, the circuit structure shown in FIG. 2 increases the filter impedance seen from the antenna side in the frequency range from 832 MHz to 870 MHz from a value close to zero (1.50–j11.2 to 3.66+j15.64) to a much larger value (120+j307.4 to 6.96+j43.89). This effect is due to the division of the stripline into two parts and the insertion of the 2.5-pF capacitor 138.

On the receive side, the impedance of the receive filter 210, considered alone, in the transmit band is somewhat higher than was the impedance of the transmit filter 110, considered alone, in the receive band, so it is not necessary to add an extra transmission line.

Dividing the transmission line on the transmitting side and inserting the shunt capacitor 138 also reduces the size of the phase loops on the Smith charts, indicating that good impedance matching is obtained.

Optimization of the matching circuits 120, 220, 300 at each pair of terminals enables an antenna duplexer to be obtained that combines low loss with high adjacent-band attenuation. Specifically, 2.34-dB transmit insertion loss and 3.87-dB receive insertion loss are obtained over 38-MHz passbands, and 31.49-dB transmit-side attenuation and 45.41-dB receive-side attenuation are obtained over corresponding 38-MHz stopbands.

In the circuit described above, in the design of the matching circuits 120, 220, 300, the impedance Za seen from nodes Na, Nb in FIG. 2, the impedance Zt seen from nodes Nc, Nd, and the impedance Zr seen from nodes Ne, Nf are less than fifty ohms (50Ω), so low-pass L-section matching networks are used. If the impedances Za, Zt, Zr seen from these nodes Na, Nb, Nc, Nd, Ne, Nf were greater than fifty ohms (the characteristic impedance), reverse L-section matching networks could be used as impedance-matching circuits.

Figure 12:
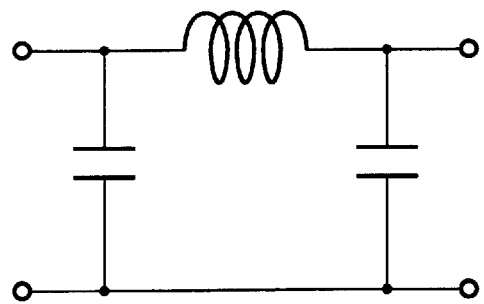
Figure 13:
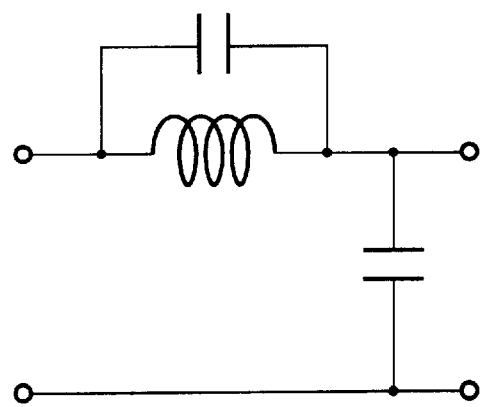
Figure 14:
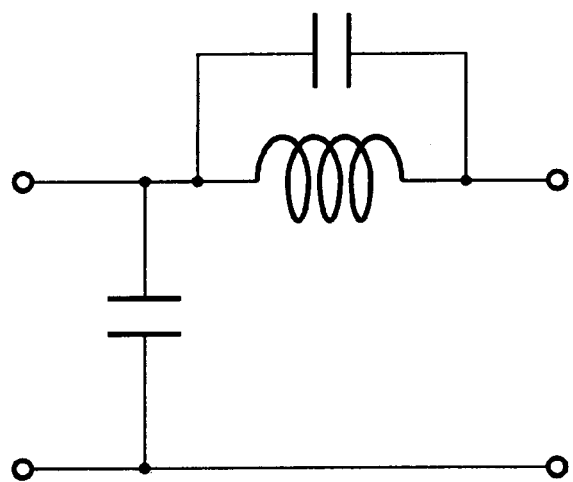
Figure 15:
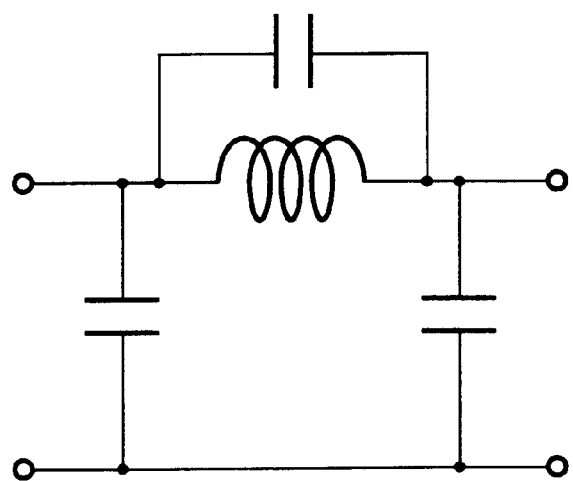

More generally, any of the matching networks shown in FIGS. 10 to 15 can be used as the matching circuits 120, 220, 300. FIGS. 10, 11, 13, and 14 show L-section networks; FIGS. 12 and 15 show π-section networks. The networks in FIGS. 13 to 15, which have a series capacitor coupled in parallel with the series inductor, are suitable for harmonic matching. The specifications of the antenna duplexer will provide a basis for selecting among these matching circuits.

The transmission lines 132, 134 were described above as being formed on a BT resin substrate, but they can be formed on a glass/epoxy substrate instead. A microstripline configuration with a length of approximately 25 mm, a width of approximately 1.4 mm, and a thickness of approximately 0.8 mm is then appropriate for each transmission line.

Figure 16:
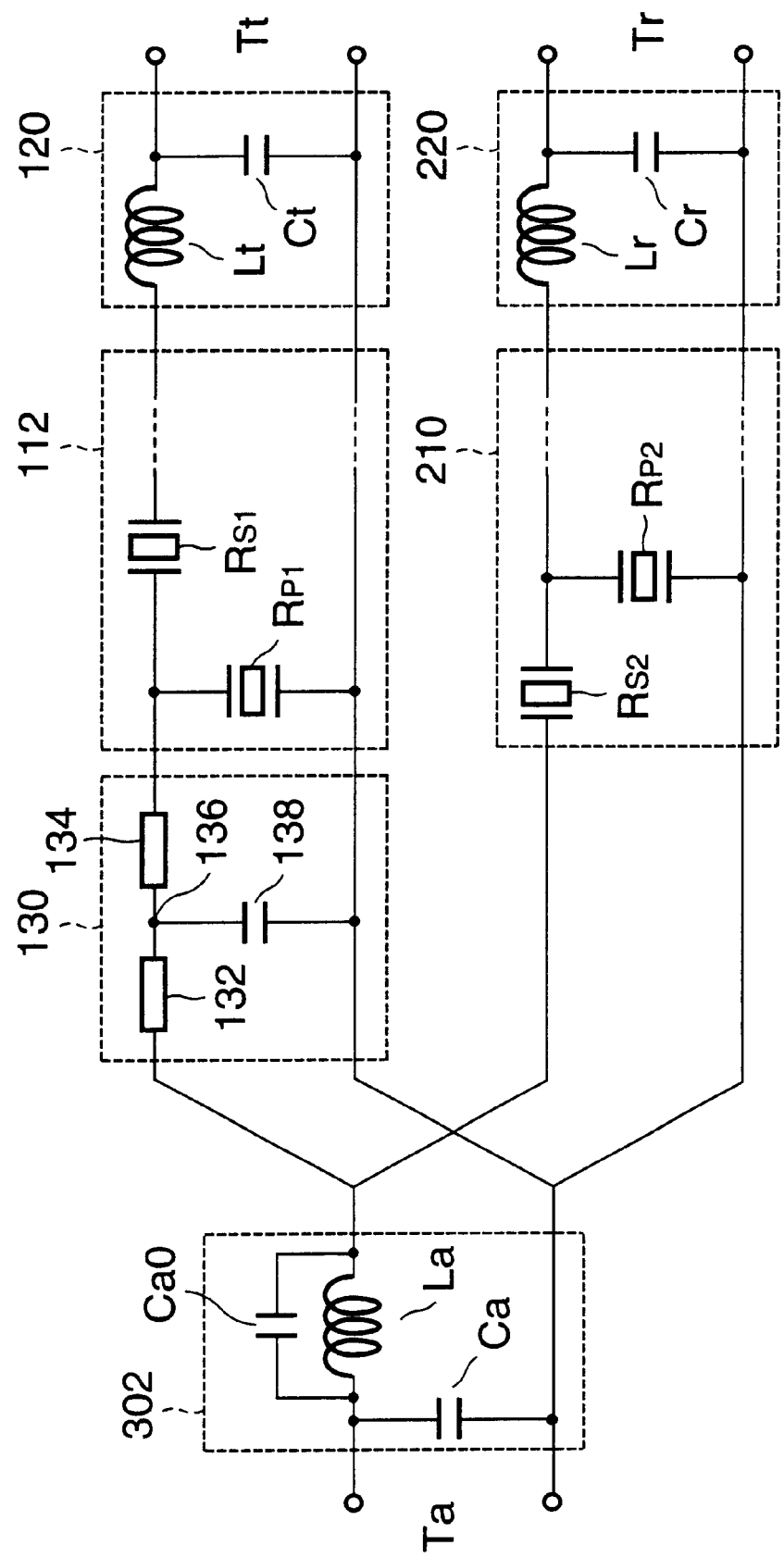
FIG. 16 is a circuit diagram of a second antenna duplexer embodying the invention.

FIG. 16 shows a second embodiment of the invention, having the same overall circuit configuration as the first embodiment. The transmit filter 110 of the first embodiment, however, is replaced by a transmit filter 112 with a different internal structure, and the antenna-end matching circuit 300 of the first embodiment is replaced by an antenna-end matching circuit 302 with a different internal structure. In the transmit filter 110 in FIG. 2, the first stage as seen from the common nodes Na, Nb was a series resonator, but in FIG. 16, the first stage of the transmit filter 112 is the shunt resonator $R_{P1}$ (the resonator on the shunt arm). The antenna-end matching circuit 302 is similar to the antenna-end matching circuit 300 in FIG. 2, but has a series capacitor Ca0 coupled in parallel with the series inductor La; that is, the circuit shown in FIG. 14 is used. These changes improve the out-of-band attenuation by providing a desired attenuation pole on the upper side of the passband.

The capacitor Ca0 and inductor La form a parallel resonance circuit. The capacitance value of the capacitor Ca0 is selected to satisfy the following equation.

$$2\pi f = 1/\sqrt{(La \cdot Ca0)} \quad (1)$$

In this equation, f is the frequency of the desired attenuation pole, La is the inductance of the inductor (La) in the parallel resonance circuit in the antenna-end matching circuit 302, and Ca0 is the capacitance of the capacitor (Ca0) in the parallel resonance circuit in the antenna-end matching circuit 302.

Figure 17:
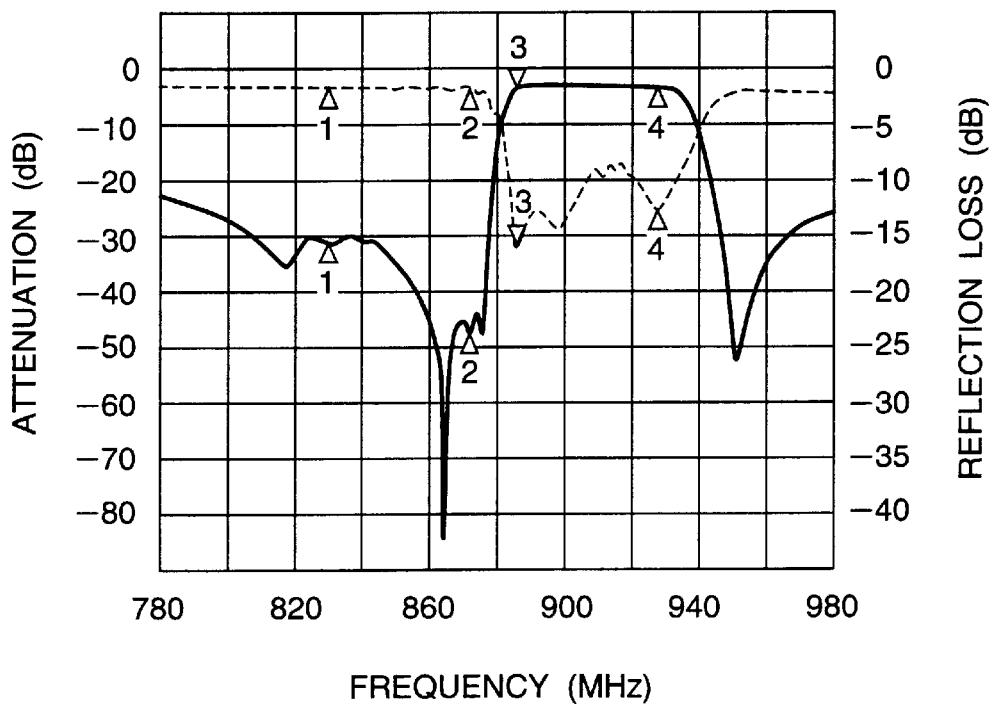
FIG. 17 is a graph showing the transmit frequency characteristic of the antenna duplexer in FIG. 16 with the matching circuits of FIG. 2.
Figure 18:
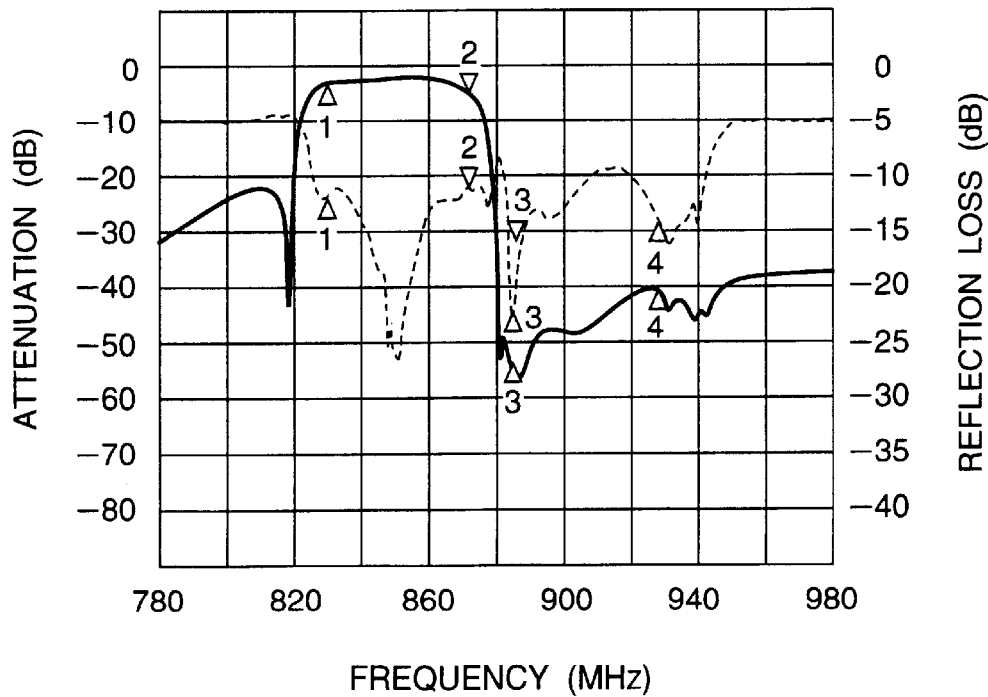
FIG. 18 is a graph showing the receive frequency characteristic of the antenna duplexer in FIG. 16 with the matching circuits of FIG. 2.
Figure 19:
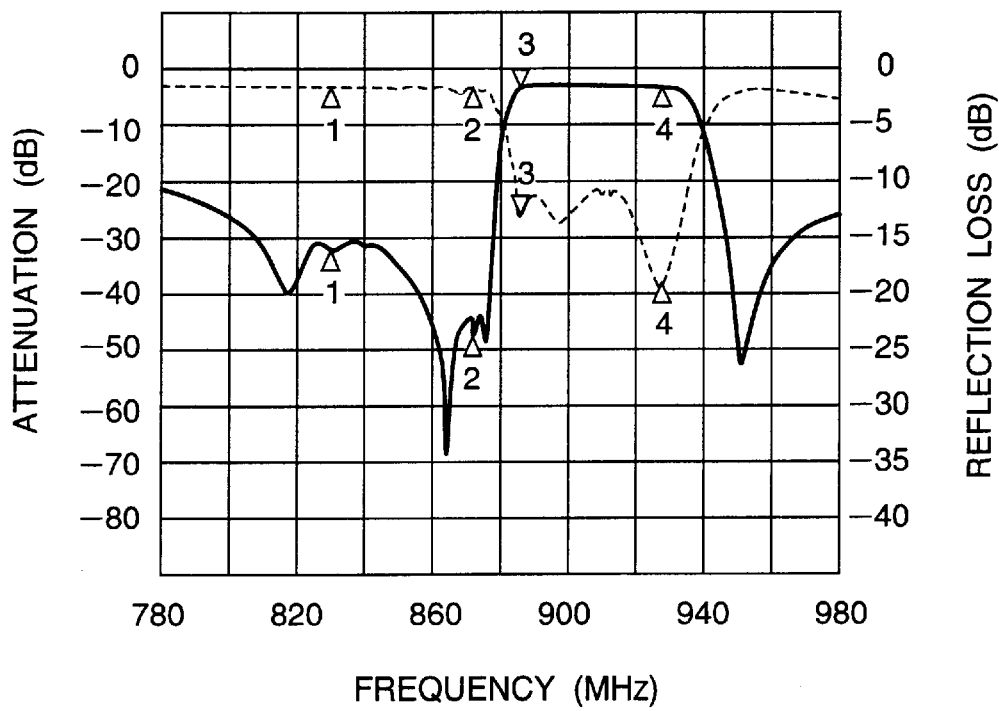
FIG. 19 is a graph showing the transmit frequency characteristic of the antenna duplexer in FIG. 16.
Figure 20:
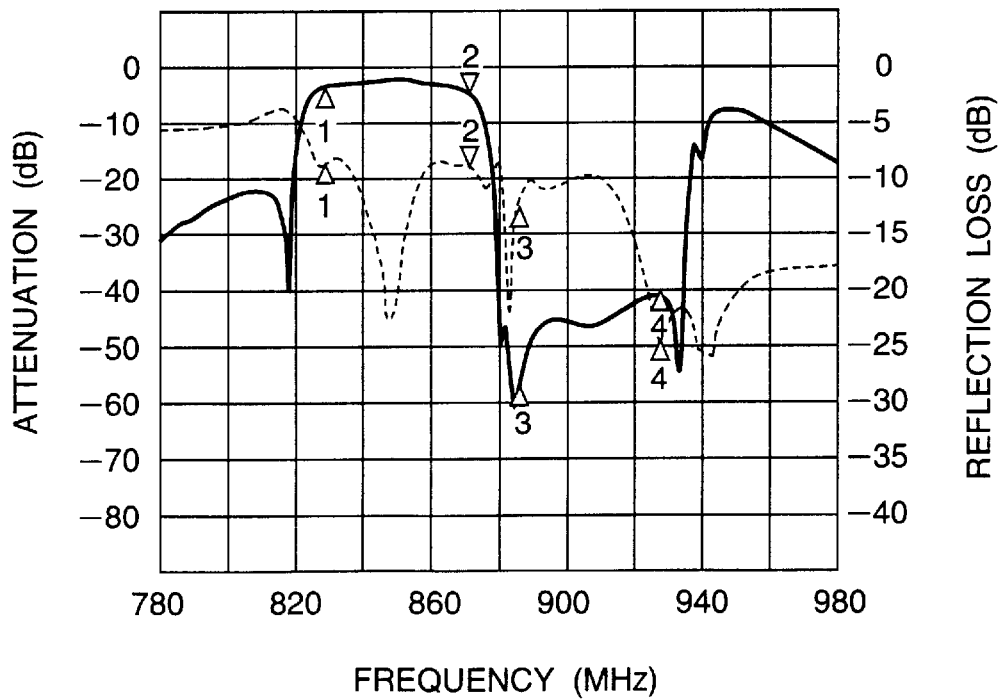
FIG. 20 is a graph showing the receive frequency characteristic of the antenna duplexer in FIG. 16.

FIGS. 19 and 20 show the frequency characteristics of the transmit side and receive side of the antenna duplexer in FIG. 16 when the capacitance Ca0 is two picofarads (2 pF). For comparison, FIGS. 17 and 18 show similar frequency characteristics when antenna-end matching circuit 300 is used instead of antenna-end matching circuit 302. The solid line in these FIGS. 17 to 20 indicates attenuation, and the dotted line indicates reflection loss, a convention that will also be followed in FIGS. 22 to 24 later. The markers in FIGS. 17 to 20 are set at positions where the following numerical values are obtained.

| FIG. 17: attenuation | | |
|---|---|---|
| Marker 1 | −30.896 dB | 830 MHz |
| Marker 2 | −46.267 dB | 872 MHz |
| Marker 4 | −3.271 dB | 927 MHz |
| FIG. 17: reflection loss | | |
| Marker 1 | −1.512 dB | 830 MHz |
| Marker 2 | −1.704 dB | 872 MHz |
| Marker 4 | −12.345 dB | 927 MHz |
| FIG. 18: attenuation | | |
| Marker 1 | −3.087 dB | 830 MHz |
| Marker 3 | −54.562 dB | 885 MHz |
| Marker 4 | −40.5 dB | 927 MHz |
| FIG. 18: reflection loss | | |
| Marker 1 | −11.507 dB | 830 MHz |
| Marker 3 | −21.882 dB | 885 MHz |
| Marker 4 | −14.398 dB | 927 MHz |
| FIG. 19: attenuation | | |
| Marker 1 | −31.925 dB | 830 MHz |
| Marker 2 | −44.101 dB | 872 MHz |
| Marker 4 | −2.870 dB | 927 MHz |
| FIG. 19: reflection loss | | |
| Marker 1 | −1.298 dB | 830 MHz |
| Marker 2 | −1.623 dB | 872 MHz |
| Marker 4 | −18.459 dB | 927 MHz |
| FIG. 20: attenuation | | |
| Marker 1 | −3.427 dB | 830 MHz |
| Marker 3 | −57.125 dB | 885 MHz |
| Marker 4 | −41.528 dB | 927 MHz |
| FIG. 20: reflection loss | | |
| Marker 1 | −8.466 dB | 830 MHz |
| Marker 3 | −19.252 dB | 885 MHz |
| Marker 4 | −23.997 dB | 927 MHz |

As can be inferred from a comparison of the frequency characteristics shown in FIGS. 19 and 20 with those in FIGS. 17 and 18, an attenuation pole appears near 1.35 gigahertz (1.35 GHz) in both the transmit and receive characteristics of the antenna duplexer when antenna-end matching circuit 302 is used as in FIG. 16, but does not appear when antenna-end matching circuit 300 is employed. An attenuation pole near 1.9 GHz also appears in the transmit characteristic.

A desirably high harmonic attenuation characteristic can accordingly be obtained by using the parallel resonance of capacitor Ca0 and inductor La in the matching circuit to manipulate the attenuation poles.

Figure 21:
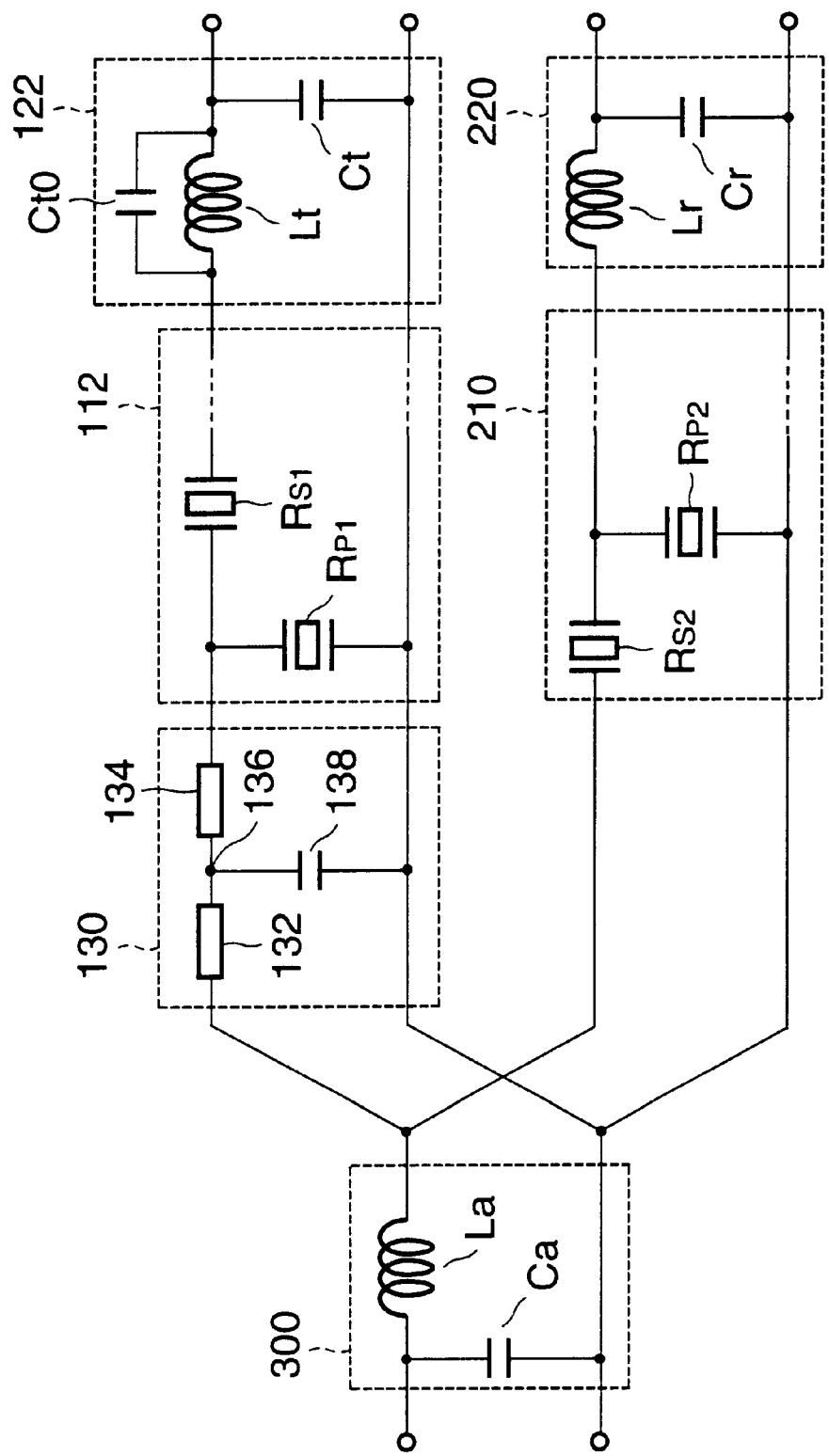
FIG. 21 is a circuit diagram of a third antenna duplexer embodying the invention.

Referring to FIG. 21, a third embodiment of the invention has the same general configuration as the second embodiment, but employs the antenna-end matching circuit 300 of the first embodiment instead of the antenna-end matching circuit 302 used in the second embodiment, and replaces the transmit-arm matching circuit 120 of the first and second embodiments with a transmit-arm matching circuit 122 having the structure shown in FIG. 13. The transmit-arm matching circuit 122 has a capacitor Ct0 coupled in parallel with the inductor Lt, forming a parallel resonance circuit. This circuit provides a desired attenuation pole on the high side of the passband, improving the out-of-band attenuation on that side.

The capacitance value of capacitor Ct0 is selected to satisfy the following equation.

$$2\pi f = 1/\sqrt{(Lt \cdot Ct0)} \quad (2)$$

In this equation, f is the frequency of the desired attenuation pole, Lt is the inductance of the inductor (Lt) in the parallel resonance circuit in the transmit-arm matching circuit 122, and Ct0 is the capacitance of the capacitor (Ct0) in the parallel resonance circuit in the transmit-arm matching circuit 122.

Figure 22:
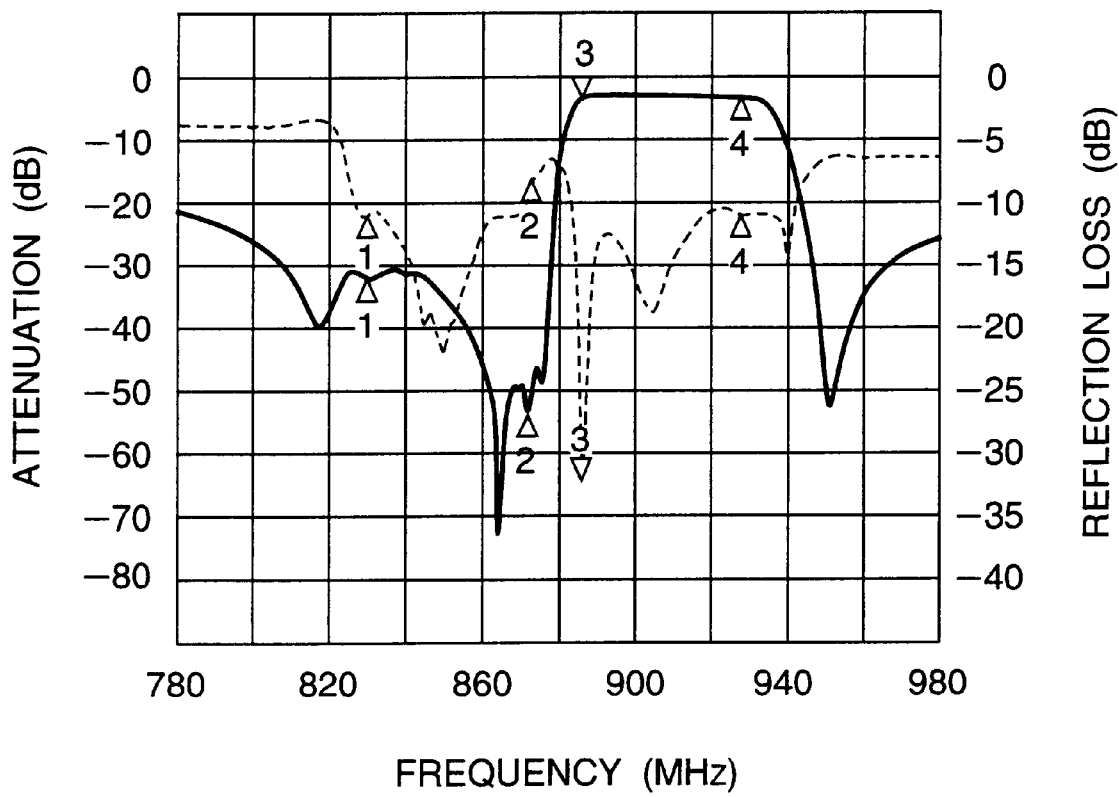
FIG. 22 is a graph showing the transmit frequency characteristic of the antenna duplexer in FIG. 21.

FIG. 22 shows the frequency characteristics of the transmit side of this antenna duplexer when the capacitance Ct0 is two picofarads (2 pF). The markers in FIG. 22 are set at positions where the following numerical values are obtained.

| FIG. 22: attenuation | | |
| --- | --- | --- |
| Marker 1 | −31.279 dB | 830 MHz |
| Marker 2 | −49.252 dB | 872 MHz |
| Marker 4 | −4.250 dB | 927 MHz |
| FIG. 22: reflection loss | | |
| Marker 1 | −11.025 dB | 830 MHz |
| Marker 2 | −8.248 dB | 872 MHz |
| Marker 4 | −10.764 dB | 927 MHz |

A comparison of FIG. 22 with FIGS. 17 and 18 shows that the use of the transmit-arm matching circuit 122 instead of the transmit-arm matching circuit 120 shifts the peak observed near 1.5 GHz down to approximately 1.2 GHz, and causes a new peak to appear new 2.4 GHz. A desirably high harmonic attenuation characteristic can accordingly be obtained by using the parallel resonance of capacitor Ct0 and inductor Lt in the matching circuit 122 to manipulate the attenuation poles.

Figure 23:
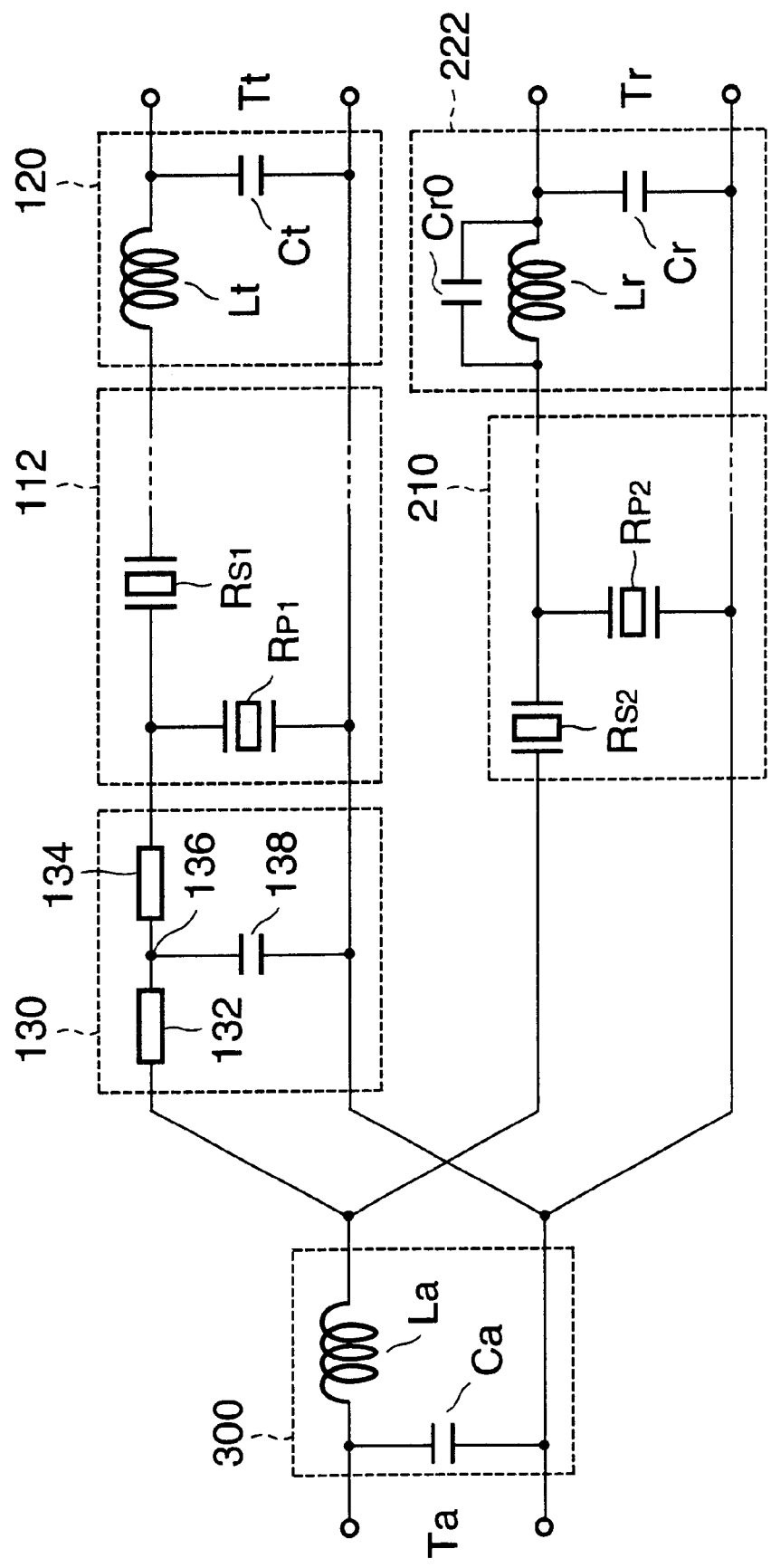
FIG. 23 is a circuit diagram of a fourth antenna duplexer embodying the invention.

Referring to FIG. 23, a fourth embodiment of the invention has the same general configuration as the third embodiment, but employs the transmit-arm matching circuit 120 of the first embodiment instead of the transmit-arm matching circuit 122 of the third embodiment, and replaces the receive-arm matching circuit 220 of the preceding embodiments with a receive-arm matching circuit 222 having the structure shown in FIG. 13. The receive-arm matching circuit 222 has a capacitor Cr0 coupled in parallel with the inductor Lr, forming a parallel resonance circuit. This circuit provides a desired attenuation pole on the high side of the passband, improving the out-of-band attenuation on that side.

The capacitance value of capacitor Cr0 is selected to satisfy the following equation.

$$2\pi f = 1/\sqrt{(Lr \cdot Cr0)} \quad (3)$$

In this equation, f is the frequency of the desired attenuation pole, Lr is the inductance of the inductor (Lr) in the parallel resonance circuit in the receive-arm matching circuit 222, and Cr0 is the capacitance of the capacitor (Cr0) in the parallel resonance circuit in the receive-arm matching circuit 222.

Figure 24:
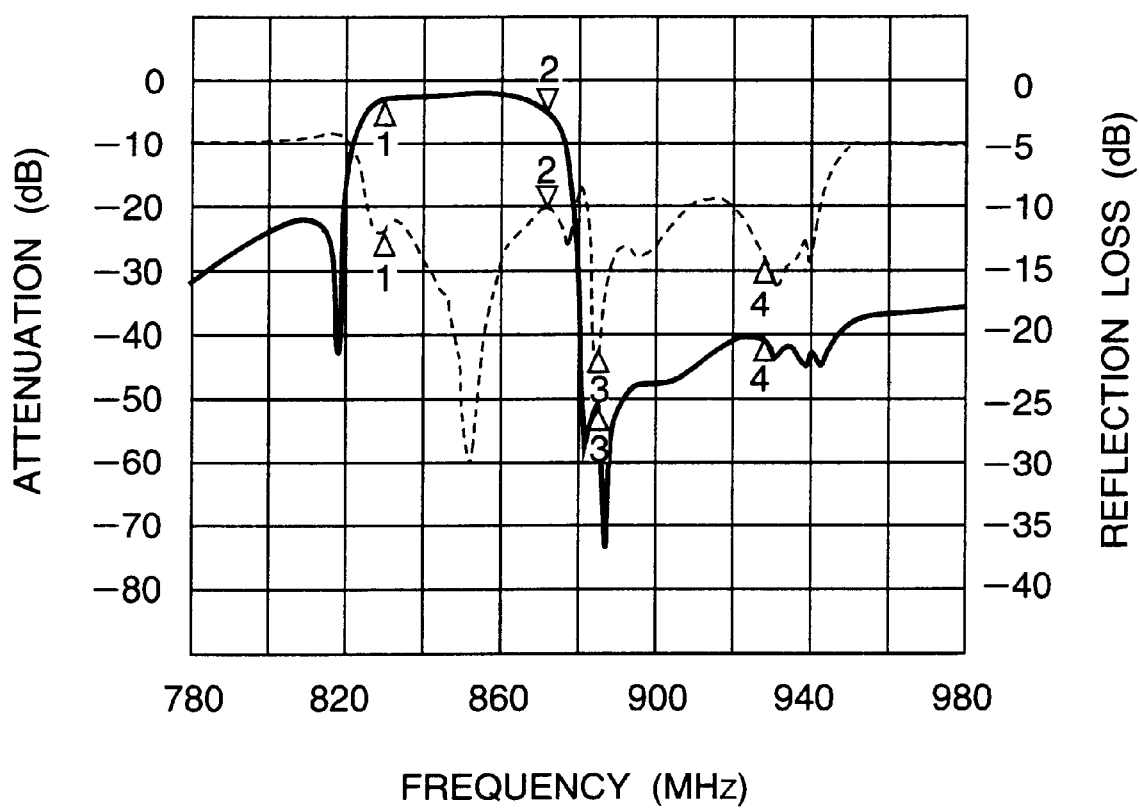
FIG. 24 is a graph showing the transmit frequency characteristic of the antenna duplexer in FIG. 23.

FIG. 24 shows the frequency characteristics of the receive side of this antenna duplexer when the capacitance Ct0 is two picofarads (2 pF). The markers in FIG. 24 are set at positions where the following numerical values are obtained.

| FIG. 24: attenuation | | |
| --- | --- | --- |
| Marker 1 | −3.002 dB | 830 MHz |
| Marker 3 | −52.22 dB | 885 MHz |
| Marker 4 | −39.968 dB | 927 MHz |
| FIG. 24: reflection loss | | |
| Marker 1 | −12.855 dB | 830 MHz |
| Marker 3 | −21.774 dB | 885 MHz |
| Marker 4 | −14.31 dB | 927 MHz |

A comparison of FIG. 24 with FIGS. 17 and 18 shows that the use of the receive-arm matching circuit 222 instead of the receive-arm matching circuit 220 causes an attenuation pole to appear near 1.9 GHz. A desirably high harmonic attenuation characteristic can accordingly be obtained by using the parallel resonance of capacitor Cr0 and inductor Lr in the matching circuit 222 to manipulate the attenuation poles.

Figure 25:
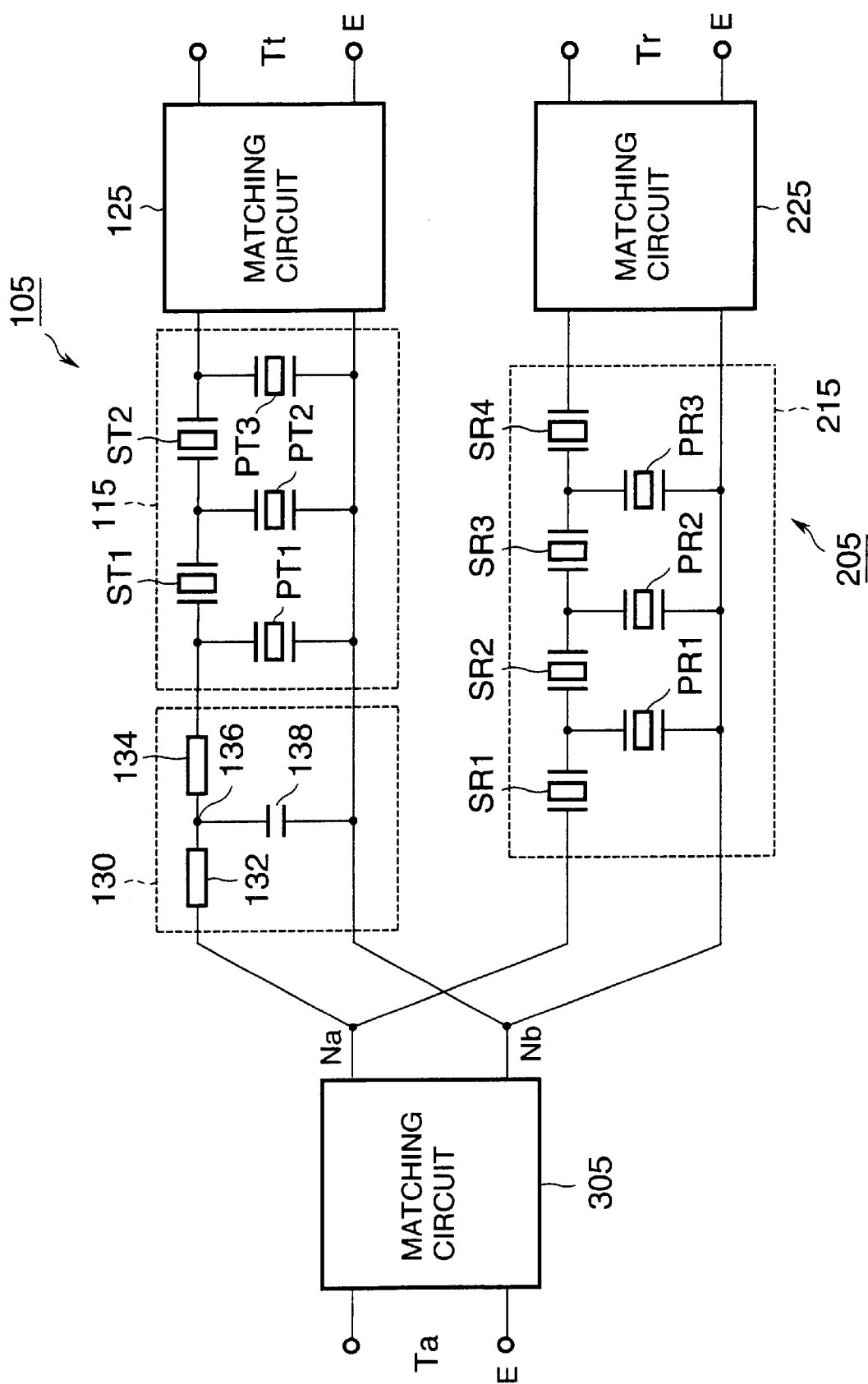
FIG. 25 is a circuit diagram of a fifth antenna duplexer embodying the invention.

FIG. 25 is a circuit diagram of an antenna duplexer illustrating a fifth embodiment of the invention. Like the antenna duplexer of the first embodiment, this antenna duplexer is designed for a transmit band of 887–925 MHz and a receive band of 832–870 MHz, carrying signals from a pair of transmit terminals Tt to a pair of antenna terminals Ta, and from the antenna terminals Ta to a pair of receive terminals Tr, the two signal paths meeting at a pair of common nodes Na, Nb. A transmit arm 105 is disposed between the common nodes Na, Nb and the transmit terminals Tt, a receive arm 205 is disposed between the common nodes Na, Nb and the receive terminals Tr, and a matching circuit 305 is disposed between the common nodes Na, Nb and the antenna terminals Ta.

The transmit arm 105 includes a transmit filter 115, a transmit-arm matching circuit 125, and a transmit-arm transmission-line circuit 130. The receive arm 205 includes a receive filter 215 and a receive-arm matching circuit 225. The matching circuits used in the first embodiment may be used as the matching circuits 125, 225, 305. The transmit-arm transmission-line circuit 130 has the same internal structure as in the first embodiment.

The transmit filters 115, 215 are SAW filters of the general type described in the prior art and the first embodiment, each comprising a plurality of resonators connected in a ladder network, each resonator having a single pair of interdigital transducers (not visible) and a pair of reflectors (not visible).

As shown in the drawing, the transmit filter 115 comprises two series resonators ST1, ST2 and three shunt resonators PT1, PT2, PT3. The receive filter 215 has four series resonators SR1, SR2, SR3, SR4 and three shunt resonators PR1, PR2, PR3.

As seen from the antenna terminals Ta, the first stage of the transmit filter 115 is a shunt resonator PT1, which is coupled to the common nodes Na, Nb through the transmit-arm transmission-line circuit 130. As seen from the antenna terminals, the first stage of the receive filter 215 is a series resonator SR1, which is connected directly to common node Na.

Table 1 indicates the aperture (A), number of electrode fingers (N), and pole frequencies (f) of the resonators in the transmit filter 115. Table 2 give similar information for the resonators in the receive filter 215.

TABLE 1

| Resonator | ST1 | ST2 | PT1 | PT2 | PT3 |
|---|---|---|---|---|---|
| A (μm):N | 53:120 | 53:120 | 80:80 | 80:80 | 80:80 |
| f (MHz) | 945 | 945 | 870 | 870 | 870 |

TABLE 2

| Resonator | SR1 | SR2 | SR3 | SR4 | PR1 | PR2 | PR3 |
|---|---|---|---|---|---|---|---|
| A(μm):N | 130:120 | 65:120 | 65:120 | 130:100 | 88:99 | 88:99 | 88:99 |
| f(MHz) | 885 | 885 | 885 | 885 | 820 | 820 | 820 |

Figure 26:
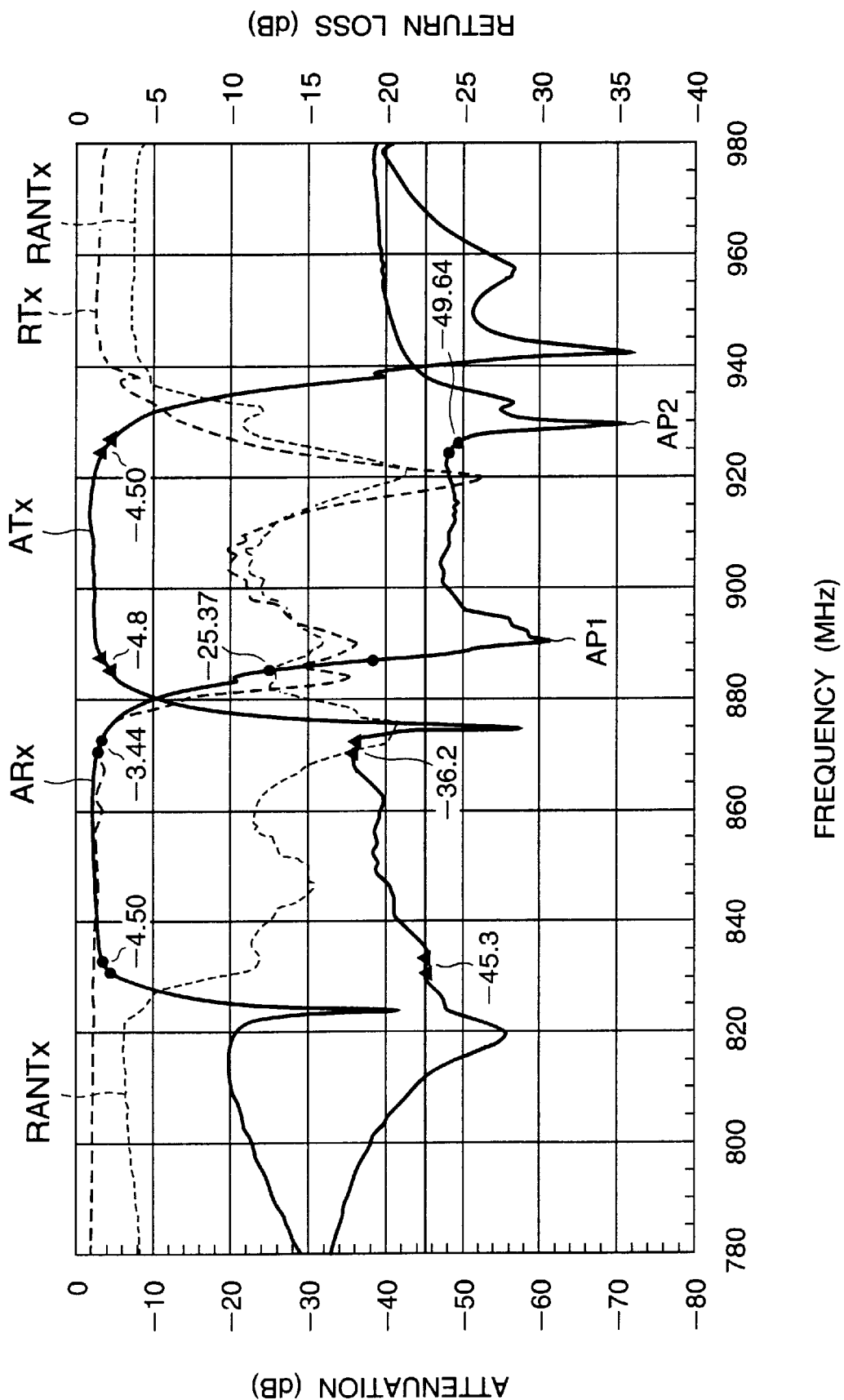
FIG. 26 is a graph showing frequency characteristics of the antenna duplexer in FIG. 25.

FIG. 26 shows various characteristics of the fifth embodiment. The curve marked ATx is the attenuation characteristic of the transmit filter 115. Curve ARx is the attenuation characteristic of the receive filter 215. Curve RTx is the return loss of the transmit filter 115. Curve RANTX is the return loss of the antenna end of the antenna duplexer. As the receive attenuation characteristic ARx shows, besides the point of infinite attenuation that occurs in the SAW filter near the low end of the transmit passband (attenuation pole AP1 at 890 MHz), there is another point of infinite attenuation (attenuation pole AP2 at 930 MHz) near the high end of the transmit passband. If the transmission line in the transmit-arm transmission-line circuit 130 were not divided, attenuation pole AP1 would appear, but attenuation pole AP2 would not. Thus it is possible to use the transmission lines in the antenna duplexer to create an attenuation pole at a desired frequency and further improve the performance of the antenna duplexer characteristics.

The reason why attenuation pole AP2 appears in the circuit shown in FIG. 25 will be explained below. The explanation will make use of the lumped-constant equivalent circuit of a SAW resonator shown in 'Kyoshinkigata SAW firuta no shuchu teisuu toka kairo ni yoru kosatsu' (A study using a lumped-constant equivalent circuit of a resonator-type SAW filter), paper No. A-312 at the 1996 general meeting of the Institute of Electronics, Information, and Communication Engineers of Japan.

Figure 27:
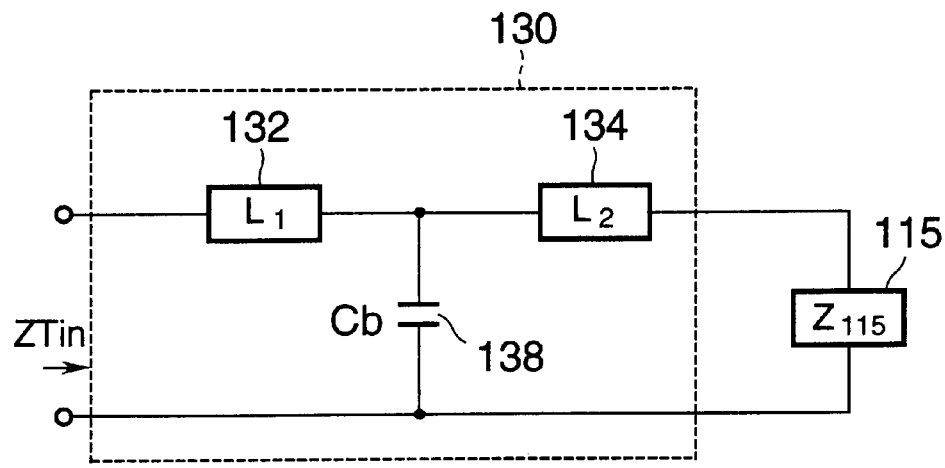
FIG. 27 is a circuit diagram illustrating impedances around the transmit-arm transmission-line circuit in FIG. 25.

The input impedance of the transmit-arm transmission-line circuit 130 and transmit filter 115 in FIG. 25 is the impedance ZTin shown in FIG. 27, given by the following equation.

$$ZTin = j\omega L_1 + j\omega L_2(1+(j\omega)^2 L_2 Cb) \quad (4)$$

where $L_1$ is the inductance of the first transmission line 132, $L_2$ is the inductance of the second transmission line 134, and Cb is the capacitance of capacitor 138. Incidentally, $Z_{115}$ in FIG. 27 represents the impedance of the transmit filter 115.

In the receive filter characteristic, accordingly, it may occur that the above equation (4) is zero at a point other than an attenuation pole of the SAW resonators. The frequencies ω(∞) corresponding to the frequencies f(∞) of attenuation poles are given by the following equation (5).

$$\omega(\infty) = \sqrt{\{(L_1+L_2)/(L_1 * L_2 * Cb)\}} \quad (5)$$

Figure 28:
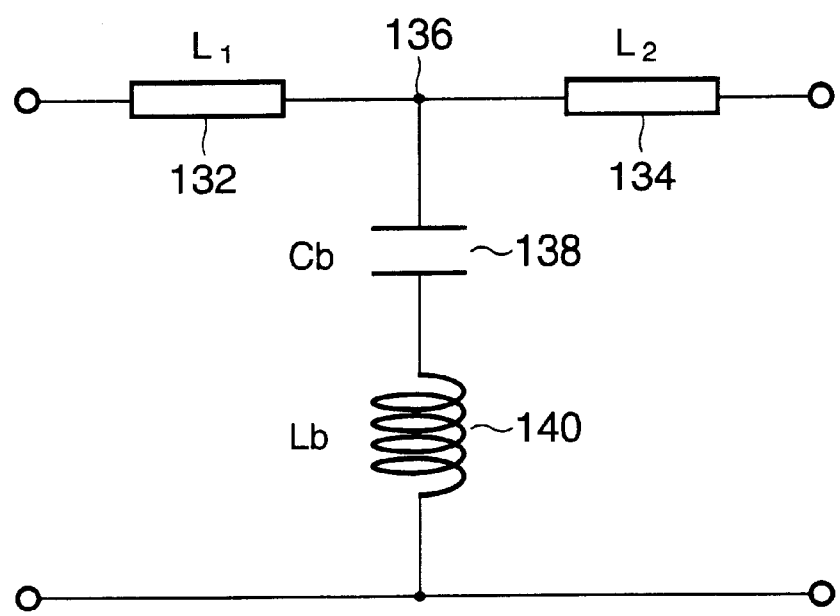
FIG. 28 is a circuit diagram showing a variation of the transmit-arm transmission-line circuit in FIG. 25.

It can be seen that the attenuation pole frequency f(∞) is related to the stripline lengths (proportional to $L_1$ and $L_2$) and the added capacitance Cb. It can also be seen from equations (4) and (5) that, as an attenuation pole is obtained when the input impedance of the transmit filter is zero, an attenuation pole will similarly arise if an inductor 140 with inductance Lb is added in series with the capacitor 138, forming a series resonance circuit as shown in FIG. 28.

The preceding embodiments were designed for the Japanese CDMA-One system, but the invention can also be practiced in systems in which the receive frequency is higher than the transmit frequency.

Figure 29:
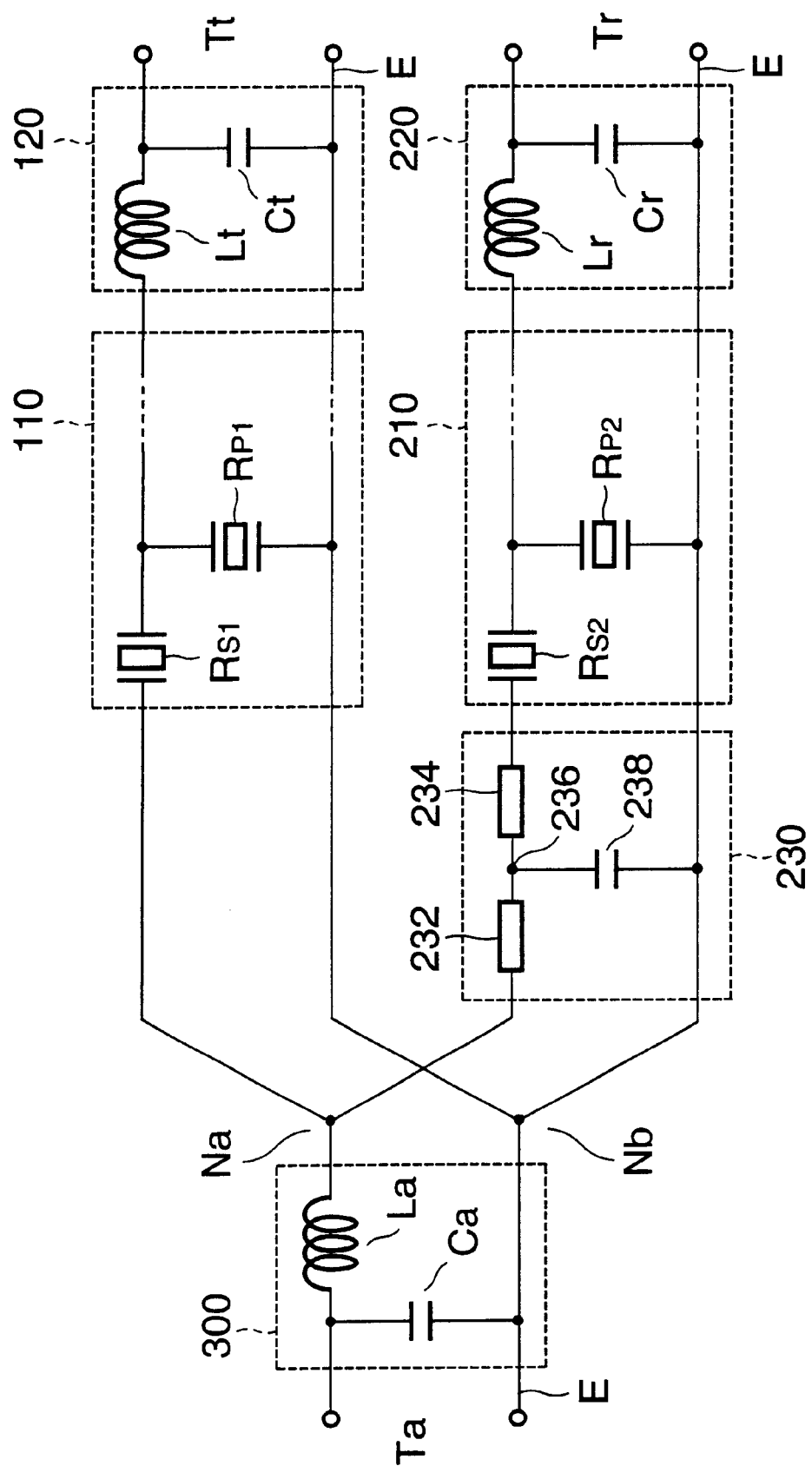
FIG. 29 is a circuit diagram of a sixth antenna duplexer embodying the invention.

FIG. 29 shows a sixth embodiment, similar to the first embodiment, except that the transmit-arm transmission-line circuit 130 is replaced by a receive-arm transmission-line circuit 230 coupled between the receive filter 210 and the common nodes Na, Nb. Resonators $R_{S1}$ and $R_{P1}$ are designed so that the passband of the transmit filter 110 is, for example, 824–849 MHz. Resonators $R_{S2}$ and $R_{P2}$ are designed so that the passband of the receive filter 210 is, for example, 869–894 MHz. The receive-arm transmission-line circuit 230 has the same internal structure as the transmit-arm transmission line circuit 130 described above, comprising a pair of transmission lines 232, 234 joined at an internal node 236, which is grounded through a grounding circuit comprising a capacitor 238. This receive-arm transmission-line circuit 230 and in particular the capacitor 238 improve the lower stopband impedance of the receive filter 210, in the frequency region occupied by the passband of the transmit filter 110.

Figure 30:
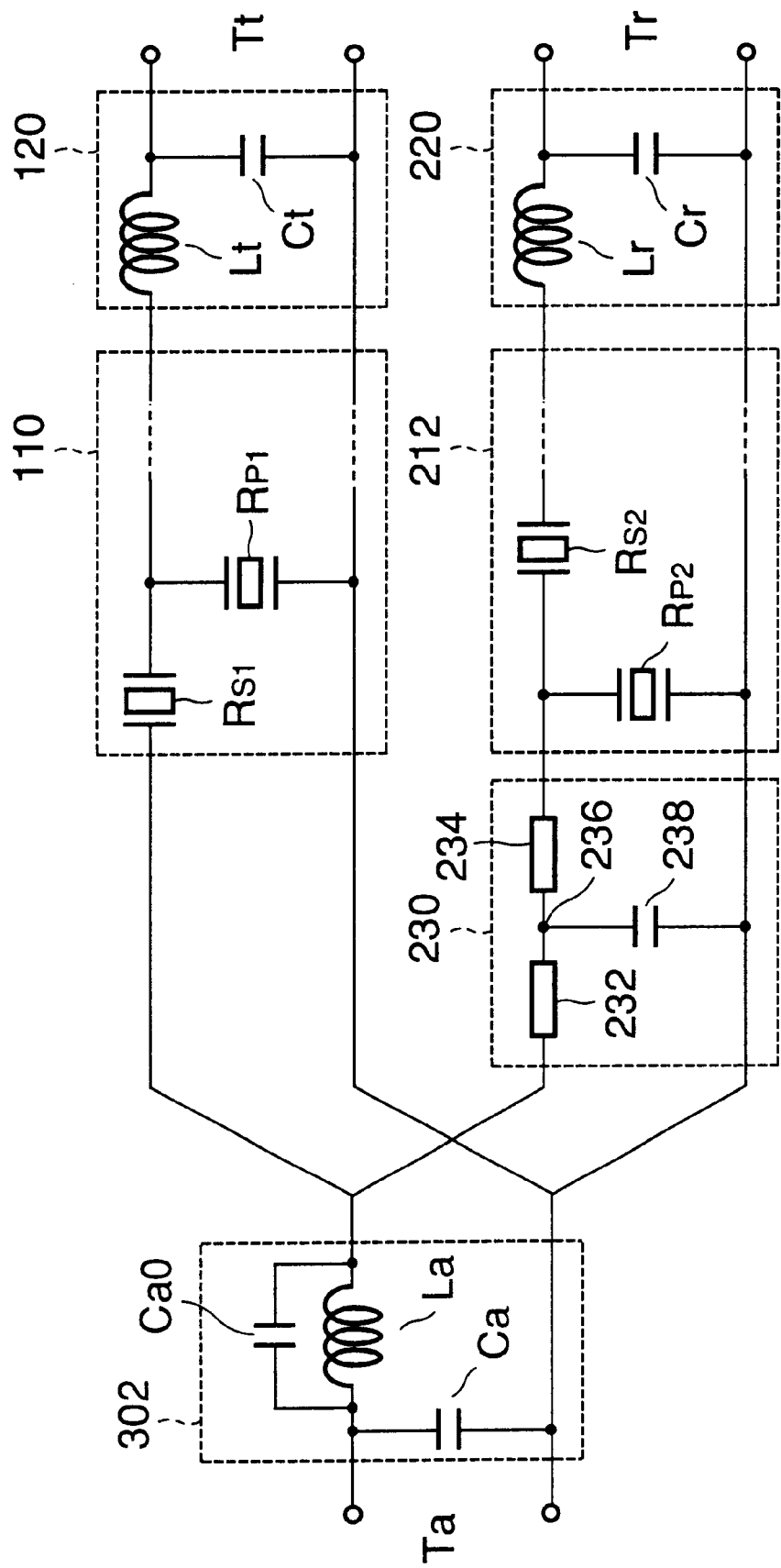
FIG. 30 is a circuit diagram of a seventh antenna duplexer embodying the invention.

FIG. 30 shows a seventh embodiment, similar to the sixth embodiment except that receive filter 212 now has a shunt resonator $RP_2$ as its first stage, nearest the common nodes Na, Nb, and the antenna-end matching circuit 302 described in the second embodiment is employed.

Figure 31:
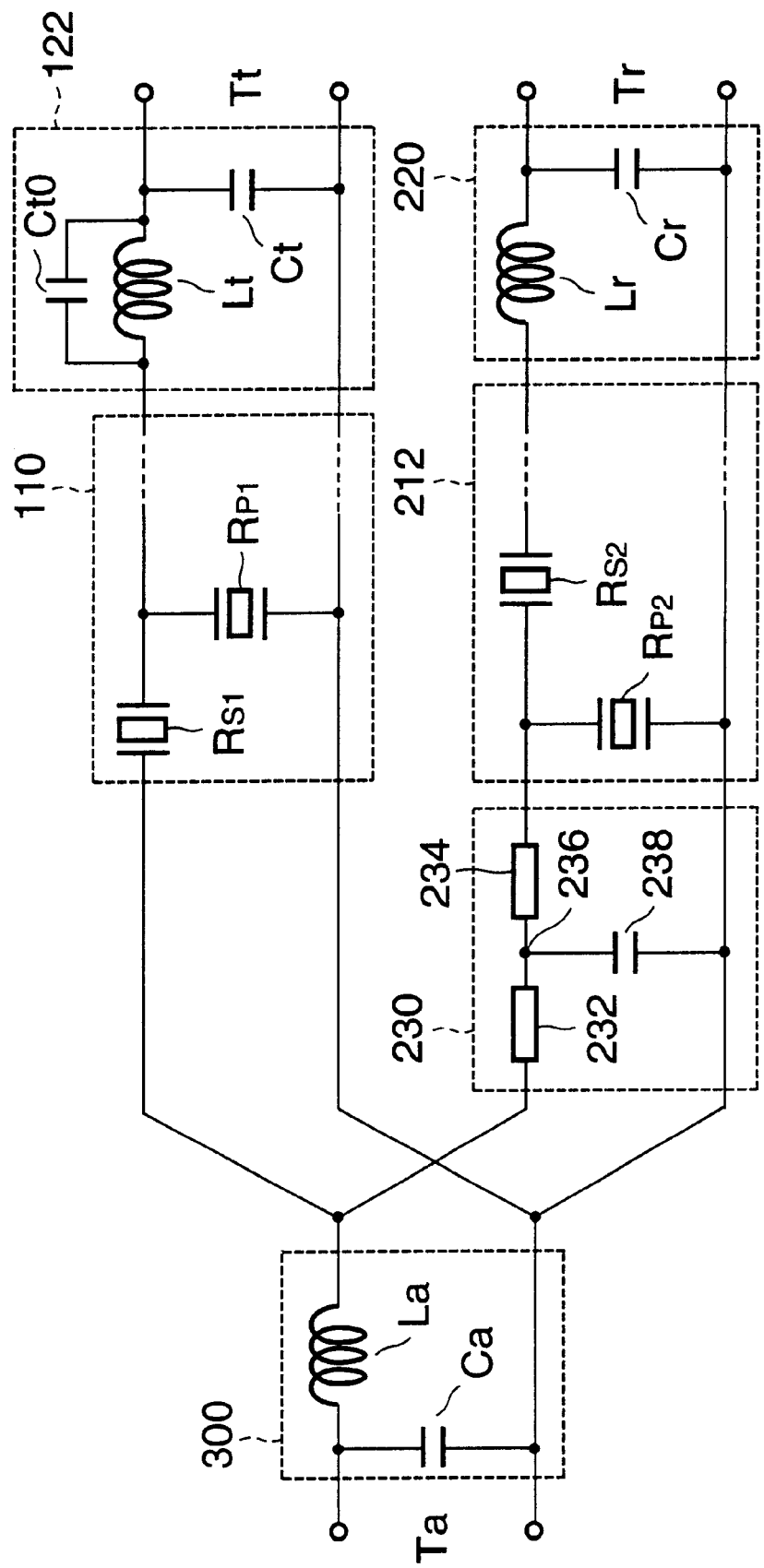
FIG. 31 is a circuit diagram of a eighth antenna duplexer embodying the invention.

FIG. 31 shows an eighth embodiment, similar to the seventh embodiment except that the antenna-end matching circuit 300 and transmit-arm matching circuit 122 of the third embodiment are employed.

Figure 32:
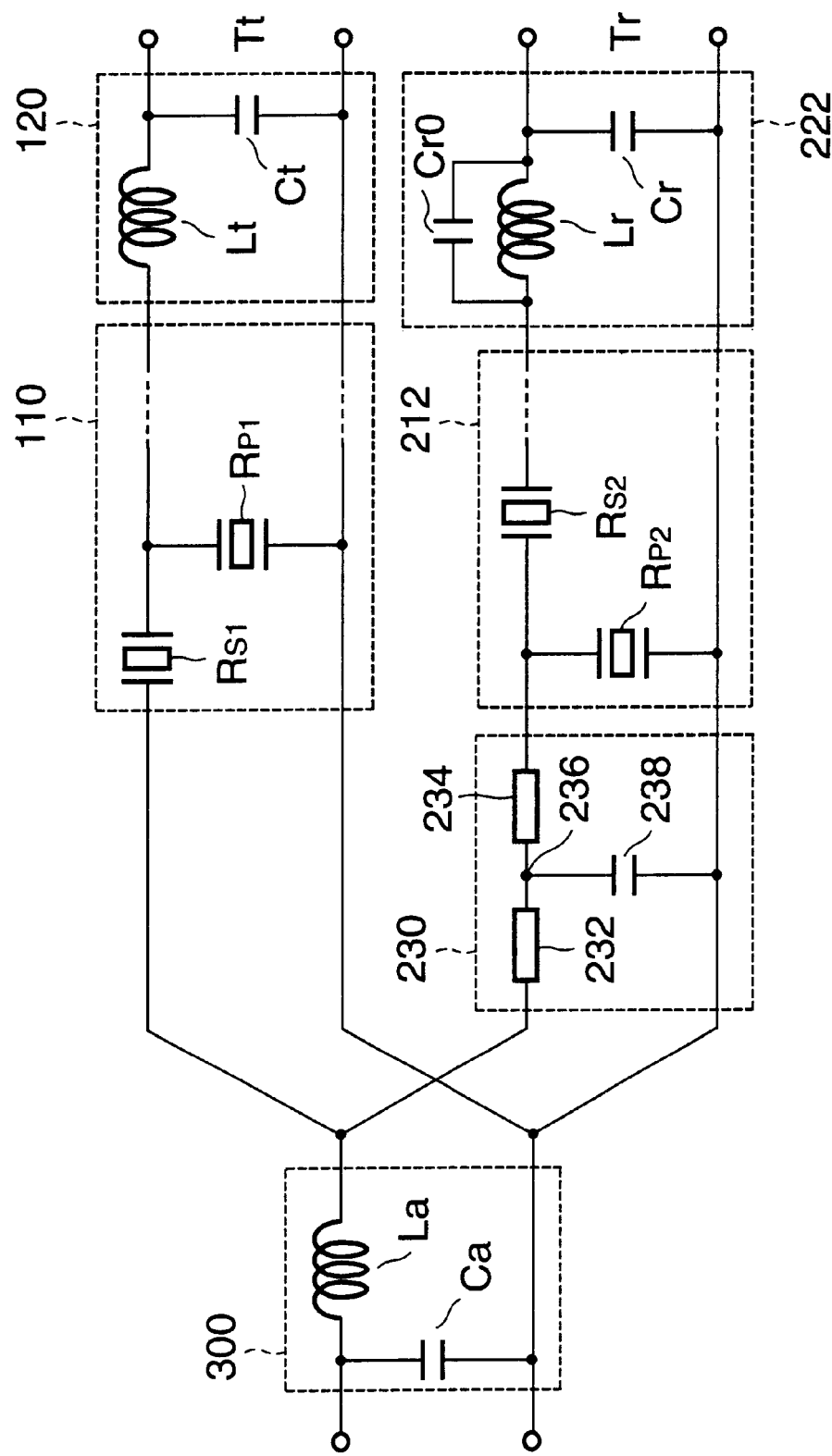
FIG. 32 is a circuit diagram of a ninth antenna duplexer embodying the invention.

FIG. 32 shows a ninth embodiment, similar to the seventh embodiment except that antenna-end matching circuit 300 and receive-arm matching circuit 222 of the fourth embodiment are employed.

Figure 33:
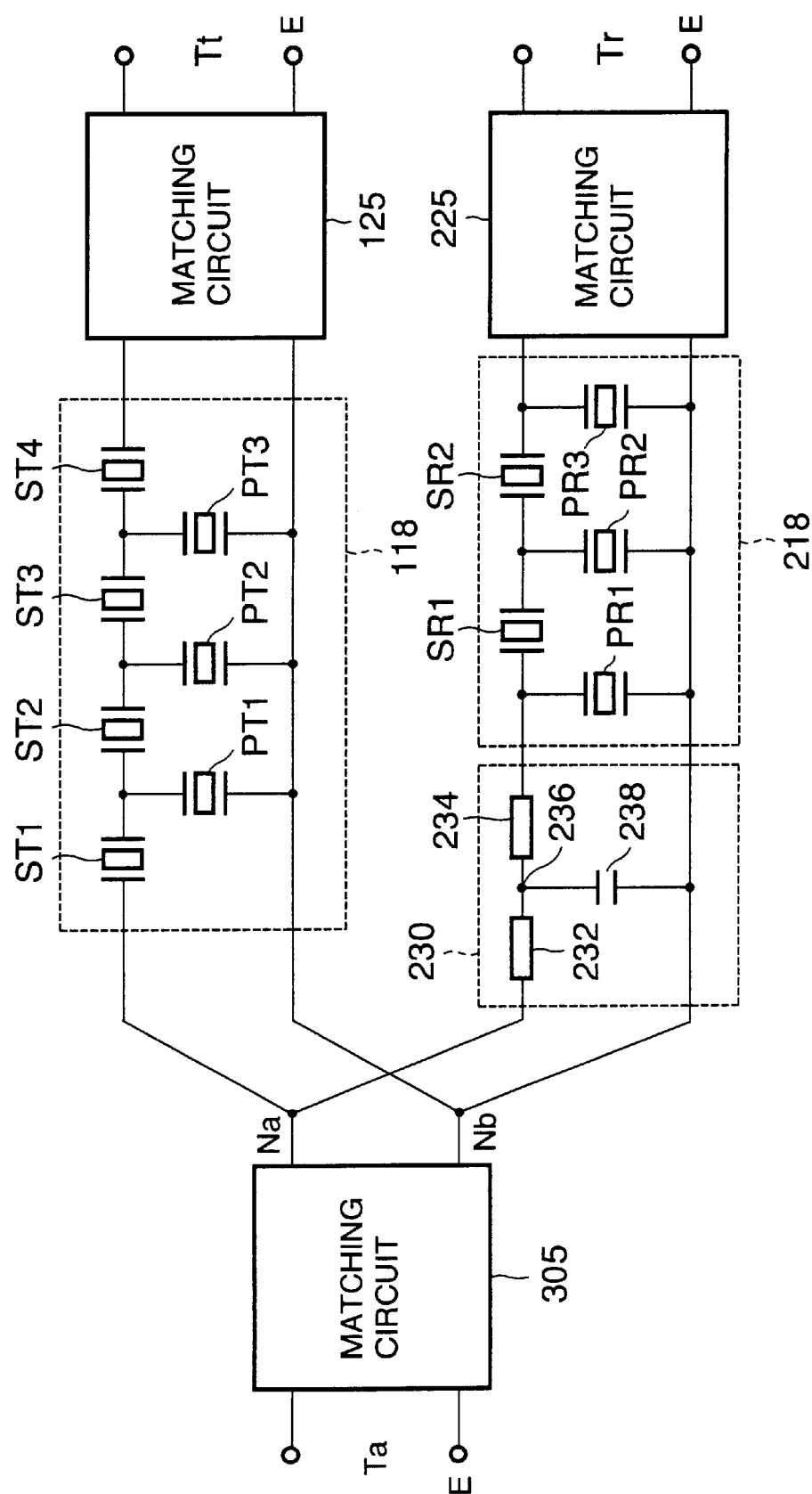
FIG. 33 is a circuit diagram of a tenth antenna duplexer embodying the invention.

FIG. 33 shows a tenth embodiment, in which the transmit filter 118 has a structure similar to the receive filter 215 of the fifth embodiment, and the receive filter 218 has a structure similar to the transmit filter 115 of the fifth embodiment. The matching circuits 125, 225, 305 of the fifth embodiment and the receive-arm transmission-line circuit 230 of the sixth embodiment complete the duplexer configuration.

The transmit and receive filters in FIGS. 30 to 33 have, for example, the passband frequencies described in the sixth embodiment. The receive passband is higher than the transmit passband.

By providing a divided transmission line that is coupled to ground at the division point, the present invention is able to reduce the size of the phase loops of the impedance seen from the antenna end (this size is a measure of impedance mismatch), to increase the impedance of the receive filter in the passband of the transmit filter, and to increase the impedance of the transmit filter in the passband of the receive filter. In particular, the lower stopband impedance of the filter with the higher-frequency passband is increased.

In the embodiments above, a capacitor was used to ground the internal node of the transmission-line circuit, but an inductor may be used instead of a capacitor, an inductor and capacitor may be used in series as shown in FIG. 28, an inductor and a capacitor may be used in parallel, or a SAW resonator may be used.

Those skilled in the art will recognize that further variations are possible within the scope claimed below.

What is claimed is:

1. An antenna duplexer having a common node, a first signal terminal, a first filter coupled between the common node and the first signal terminal, a second signal terminal, a second filter coupled between the common node and the second signal terminal, and an antenna signal terminal coupled to the common node, the first filter and the second filter each having at least one series resonator and at least one shunt resonator coupled in a ladder configuration, the first filter having a first passband, the second filter having a second passband lower than the first passband, the antenna duplexer also comprising:

a transmission-line circuit with an internal node, a first transmission line coupling the common node to the internal node, a second transmission line coupling the internal node to the first filter, and a grounding circuit coupling the internal node to ground, the first transmission line being longer than the second transmission line.

2. The antenna duplexer of claim 1, wherein the first signal terminal is a transmit signal terminal and the second signal terminal is a receive signal terminal.

3. The antenna duplexer of claim 1, wherein the first signal terminal is a receive signal terminal and the second signal terminal is a transmit signal terminal.

4. The antenna duplexer of claim 1, wherein the resonator in the first filter disposed closest to the common node is a series resonator, and the resonator in the second filter disposed closest to the common node is also a series resonator.

5. The antenna duplexer of claim 1, wherein the resonator in the first filter disposed closest to the common node is a shunt resonator, and the resonator in the second filter disposed closest to the common node is a series resonator.

6. The antenna duplexer of claim 1, wherein the grounding circuit comprises a capacitor.

7. The antenna duplexer of claim 1, wherein the first transmission line and the second transmission line are striplines formed on a bismaleimide-triazine resin substrate, each stripline being substantially 33 mm thick and 0.14 mm wide, the first transmission line being substantially 21.5 mm long, the second transmission line being substantially 18.5 mm long.

8. The antenna duplexer of claim 1, further comprising:

a first matching circuit having a first series inductor coupled between the first filter and the first signal terminal and a first shunt capacitor coupled between the first series inductor and ground;

a second matching circuit having a second series inductor coupled between the second filter and the second signal terminal and a second shunt capacitor coupled between the second series inductor and ground; and a third matching circuit having a third series inductor coupled between the common node and the antenna signal terminal and a third shunt capacitor coupled between the third series inductor and ground.

9. An antenna duplexer having a common node, a first signal terminal, a first filter coupled between the common node and the first signal terminal, a second signal terminal, a second filter coupled between the common node and the second signal terminal, and an antenna signal terminal coupled to the common node, the first filter and the second filter each having at least one series resonator and at least one shunt resonator coupled in a ladder configuration, the first filter having a first passband, the second filter having a second passband lower than the first passband, the antenna duplexer also comprising:

a transmission-line circuit with an internal node, a first transmission line coupling the common node to the internal node, a second transmission line coupling the internal node to the first filter, and a grounding circuit coupling the internal node to ground, wherein the first transmission line and second transmission line are striplines formed on a glass/epoxy substrate, each stripline being substantially 0.8 mm thick, 1.4 mm wide, and 25 mm long.

* * * * *